US010254349B2

(12) United States Patent
Kim et al.

(10) Patent No.: US 10,254,349 B2
(45) Date of Patent: Apr. 9, 2019

(54) METHOD FOR PREDICTING STATE OF HEALTH OF BATTERY BASED ON NUMERICAL SIMULATION DATA

(71) Applicant: KOREA UNIVERSITY OF TECHNOLOGY AND EDUCATION INDUSTRY-UNIVERSITY COOPERATION, Cheonan-si (KR)

(72) Inventors: Kwang Sun Kim, Cheonan-si (KR); Kyung Min Jang, Cheonan-si (KR); Kang Wo Joo, Cheonan-si (KR)

(73) Assignee: KOREA UNIVERSITY OF TECHNOLOGY AND EDUCATION INDUSTRY-UNIVERSITY COOPERATION, Cheonan-si (KR)

( * ) Notice: Subject to any disclaimer, the term of this patent is extended or adjusted under 35 U.S.C. 154(b) by 0 days.

(21) Appl. No.: 15/960,767

(22) Filed: Apr. 24, 2018

(65) Prior Publication Data
US 2018/0306868 A1 Oct. 25, 2018

(30) Foreign Application Priority Data
Apr. 25, 2017 (KR) .......................... 10-2017-0053151

(51) Int. Cl.
*H02J 7/00* (2006.01)
*G01R 31/36* (2006.01)

(52) U.S. Cl.
CPC ..... *G01R 31/3651* (2013.01); *G01R 31/3679* (2013.01); *H02J 7/0029* (2013.01)

(58) Field of Classification Search
CPC ............. G01R 31/3651; G01R 31/3679; H02J 7/0029
(Continued)

(56) References Cited

U.S. PATENT DOCUMENTS

| 5,438,646 A * | 8/1995 | Davidian | G06N 3/063 706/41 |
| 10,019,470 B2 * | 7/2018 | Birdwell | G06N 3/02 |
| 2015/0100260 A1 * | 4/2015 | Joe | G01R 31/3606 702/63 |

FOREIGN PATENT DOCUMENTS

| KR | 1020070043150 A | 4/2007 |
| KR | 1020090020448 A | 2/2009 |

(Continued)

OTHER PUBLICATIONS

Analysis of Risk Assessment Factors for Gas leakage and Dispersion in Underground Power Plant, Journal of ILASS-Korea, vol. 20, Issue 2, pp. 101-106, 2015.

*Primary Examiner* — M'Baye Diao
(74) *Attorney, Agent, or Firm* — Monami Law Group PLLC.

(57) ABSTRACT

The present invention relates to a method for predicting the state of health of a battery based on numerical simulation data. A method for predicting the state of health of a battery, which is performed by a battery management system, according to an embodiment of the present invention includes: a step of obtaining a verified numerical simulation database, into which solution data of the battery is extracted and stored, when a numerical analysis result is verified by an experimental result using electrical and chemical analysis of the battery; a step of counting the number of charges or discharges when a deviation between reference data read from the verified numerical simulation database and measurement data read from the battery is within a preset range and battery capacity satisfies a preset condition; and a step of predicting a state of health of the battery using the number of charges or discharges and a classifier based on a learned machine learning algorithm.

14 Claims, 16 Drawing Sheets

(58) Field of Classification Search
USPC .............................. 320/107; 324/432; 702/63
See application file for complete search history.

(56) References Cited

FOREIGN PATENT DOCUMENTS

| | | |
|---|---|---|
| KR | 1020130073802 A | 7/2013 |
| KR | 1020140106142 A | 9/2014 |
| KR | 1020160000317 A | 1/2016 |
| KR | 101602848 B1 | 3/2016 |
| KR | 1020160050475 A | 5/2016 |
| KR | 1020160067510 A | 6/2016 |
| KR | 1020160144437 A | 12/2016 |

* cited by examiner

METHOD FOR PREDICTING STATE OF HEALTH OF BATTERY BASED ON NUMERICAL SIMULATION DATA

TECHNICAL FIELD

The present invention relates to a method for predicting the state of health of a battery based on numerical simulation data. More particularly, the present invention relates to a method for predicting the state of health of a battery based on a numerical simulation database verified by numerical analysis.

BACKGROUND ART

High energy density capable of maintaining long operating time is an emerging important research subject as lithium-ion batteries for automobiles and Energy Storage System (ESS) are being used recently. One solution is to insert various cells into one pack of which output and stability are verified.

However, excessive discharging or charging of a high energy density battery can negatively impact battery life when its characteristics are not properly identified. Heat generated from packed multiple cells, even one cell, or the environment can shorten the lifetime of the overall pack performance in particular. The shortened lifetime and initial malfunction of the battery pack occur primarily since the physical characteristics of each cell are altered unexpectedly while the lithium ion battery is repeatedly charged and discharged. Due to such substantial impact of the battery material characteristics on the performance of the pack, various numerical simulation studies on the altered characteristics have been made.

On the other hand, due to more reliable engineering numerical analysis methods and high-speed data transmission and processing in computer system, computer simulation is getting popular.

FIG. 1 is a chart showing impedances of 50 batteries manufactured by the same process. FIG. 2 is a chart showing capacities of 50 batteries manufactured by the same process.

Medium and large battery packs for hybrid vehicles and ESS require high capacity and high power systems with dozens or hundreds of single cells managed by battery management system (BMS).

As shown in FIGS. 1 and 2, lithium ion batteries have different internal characteristics (for example, impedance, capacity, etc.) even though they are manufactured in the same factory with the same manufacturing process. This means that the connected batteries have different characteristics which cause different charge and discharge rates for the pack. The battery pack is managed by the BMS. The BMS stops a cell's charging and discharging to prevent inefficient operation and prevent accidents that may occur from overcharging or over-discharging, although other cells may still need time to charge or discharge.

FIG. 3 is a chart showing different charging voltages and discharging voltages of respective batteries.

FIG. 3 shows that different characteristics of respective batteries generate different charge and discharge rates from three other batteries. A BMS of a recent commercially available lithium ion battery pack can monitor temperature, voltage, current, and SOC (e.g., state of charge or discharge) in real time. The BMS of a lithium ion battery pack can control and manage electrical circuits of a battery cell or pack when a monitoring value exceeds a normally predicted value.

This type of BMS cannot reliably predict the state of health of respective cells with different characteristics since it is very difficult to obtain predicted data on effects such as natural aging or temperature changes of the battery through real laboratory experiments.

Even under some possible limited conditions, including thermally balanced pack designs, various cases of real laboratory experiments on different Li-ion batteries are very time consuming and costly.

DETAILED DESCRIPTION OF THE INVENTION

Technical Challenge

Embodiments of the present invention provide a method for predicting the state of health of a battery based on numerical simulation data, which can reliably predict the state of health (SOH) of a battery based on numerical simulation data.

Embodiments of the present invention provide a method for predicting the state of health of a battery based on numerical simulation data. Embodiments of the present invention can predict SOC and SOH based on numerical sample cases with reliable big data predicted related to SOC and SOH.

According to an embodiment of the present invention related to a method for predicting the state of health of a battery based on numerical simulated data, an alarm or replacement signal is provided to a BMS when an abnormal operation lasts for a predetermined time within a tolerance.

However, the scope of the present invention is not limited to the above-mentioned embodiments. Rather, even though not mentioned above, modification thereof and other objectives capable of being carried by specific structures shown in the embodiments can be understood by those of ordinary skill in the art.

Solution to Solve the Problems

According to a first embodiment of the present invention, a method for predicting the state of health of a battery based on numerical simulation data may include: a step of obtaining a verified numerical simulation database, into which solution data of the battery is extracted and stored, when a numerical analysis result is verified by an experimental result using electrical and chemical analysis of the battery; a step of counting the number of charges or discharges when a deviation between reference data read from the verified numerical simulation database and measurement data read from the battery is within a preset range and battery capacity satisfies a preset condition; and a step of predicting a state of health of the battery using the number of charges or discharges and a classifier based on a learned machine learning algorithm.

The step of obtaining may include: a step of setting an initial condition for the battery; a step of performing numerical analysis through electrical and chemical analysis of the battery; a step of verifying the numerical analysis result by the experimental result; a step of extracting the solution data of the battery with respect to the numerical analysis result when the verifying step completes; and a step of storing the extracted solution data in the verified numerical simulation database and obtaining the data from the verified numerical simulation database.

The step of performing the numerical analysis may use at least one of a Species Transport Model, an Electronic Potential Model, a Chemical Reaction Model, and an Energy Balance Model.

The step of counting may count the number of charges and stops charging when the battery is fully charged during charging and counts the number of discharges when battery capacity is at a minimum capacity during discharging.

The step of counting may include: a step of reading the reference data from the verified numerical simulation database, a step of reading the measurement data from the battery which is being charged or discharged; a step of calculating a deviation between the read reference data and the read measurement data; a step of checking whether the calculated deviation is within a preset range; a step of calculating a battery capacity when the calculated deviation is within a preset range; and a step of counting the number of charges or discharges and stopping charging or discharging when the calculated battery capacity is fully charged or less than or equal to a minimum battery capacity.

The step of predicting uses a machine learning algorithm. The machine learning algorithm is a Support Vector Machine, a Bayes Classifiers, an Artificial Neural Networks, or a Decision Tree.

The method for predicting the state of health may further include a step of emergency stopping the charging or discharging of the battery through the safety algorithm when the deviation between the reference data and the measurement data is out of the preset range.

The step of emergency stopping includes: a step of reading n-th error values and (n−1)-th error values from an error database; a step of calculating a sum of error deviation values of deviations of the n-th error values and the (n−1)-th error values; a step of determining whether a preset maximum error value is less than or equal to the calculated sum of the error deviation values; a step of calculating a battery capacity at the time of charging or discharging when the preset maximum error value is more than the calculated sum of the error deviation values; and a step of emergency stopping charging or discharging the battery when the preset maximum error value is less than or equal to the calculated sum of the error deviation values. Here, the n-th and (n−1)-th are consecutive ordinal numbers.

According to a second aspect of the present invention, a method for predicting a state of health of a battery based on numerical simulation data and performed by a battery management system may include: a step of obtaining a verified numerical simulation database, into which solution data of the battery is extracted and stored, when a numerical analysis result is verified by an experimental result using electrical and chemical analysis of the battery; a step of comparing the measured data read from the battery with the reference data read from the verified numerical simulation database and a step of counting the number of charges when a charging time necessary to reach a first target voltage is within a maximum allowable time and battery capacity satisfies a first preset condition, or counting the number of discharges when a discharging time necessary to reach a second target voltage is within a minimum allowable time and the battery capacity satisfies a second preset condition; and a step of predicting a state of health of the battery using the counted number of times of charging or discharging and a classifier based on a learned machine learning algorithm.

The step of obtaining may include: a step of setting an initial condition for the battery; a step of performing numerical analysis through the electrical and chemical analysis of the battery; a step of verifying the numerical analysis result by the experimental result; a step of extracting solution data of the battery with respect to the numerical analysis result when the verification completes; and a step of storing the extracted solution data in the verified numerical simulation database and obtaining the data from the verified numerical simulation database.

The step of performing the numerical analysis may perform the numerical analysis using at least one of a Species Transport Model, an Electronic Potential Model, a Chemical Reaction Model, and an Energy Balance Model.

The step of counting counts the number of charges when the battery is fully charged during charging and stops charging, or counts the number of discharges when the battery capacity is the minimum during discharging and stops discharging.

The step of counting may include: a step of reading reference data from the previously verified numerical simulation database; a step of reading the reference data from the verified numerical simulation database; a step of reading measurement data from the battery being charged or discharged; a step of comparing the measurement data read from the battery with the reference data read from the verified numerical simulation database; a step of determining whether the charging time is within the maximum allowable time for reaching the first target voltage, or whether the discharging time is within the minimum allowable time for reaching the second target voltage, and a step of calculating capacity of the battery when the charging time is within the maximum allowable time necessary to reach the first target voltage and the battery capacity satisfies the first preset condition, or when the discharging time is within the minimum allowable time necessary to reach the second target voltage and the battery capacity satisfies the second preset condition; and a step of counting the number of charges or the number of discharges and stopping charging or discharging when the calculated battery capacity is less than or equal to a full capacity or a minimum battery capacity.

The step of predicting may predict the state of health of a battery using any one of the following machine learning algorithms, Support Vector Machine, Bayes Classifiers, Artificial Neural Networks, and Decision Tree.

The method of predicting the state of health may further include a step of emergency stopping charging the battery through a safety algorithm when the charging time is out of the maximum time for reaching the first target voltage, or emergency stopping discharging the battery through the safety algorithm when the discharging time is out of the minimum allowable time for reaching the second target voltage.

The step of emergency stopping may include: a step of reading n-th error values and (n−1)-th error values from an error database; a step of calculating a sum of error deviation values of deviations of the n-th error values and the (n−1)-th error values; a step of determining whether a preset maximum error value is less than or equal to the calculated sum of error deviation values; a step of calculating battery capacity at the time of charging or discharging when the preset maximum error value is more than the calculated sum of error deviation values; and a step of emergency stopping charging or discharging the battery when the preset maximum error value is less than or equal to the calculated sum of error deviation values.

Advantages of the Invention

Embodiments of the present invention can reliably predict the state of health (SOH) of a battery based on numerical simulation data.

Embodiments of the present invention can predict SOC and SOH based on numerical sample cases with reliable big data predicted related to SOC and SOH.

Embodiments of the present invention may provide an alarm or replacement signal to a battery management system when an abnormal operation lasts for a period of time within allowable tolerance.

BEST MODE

Figure 1:
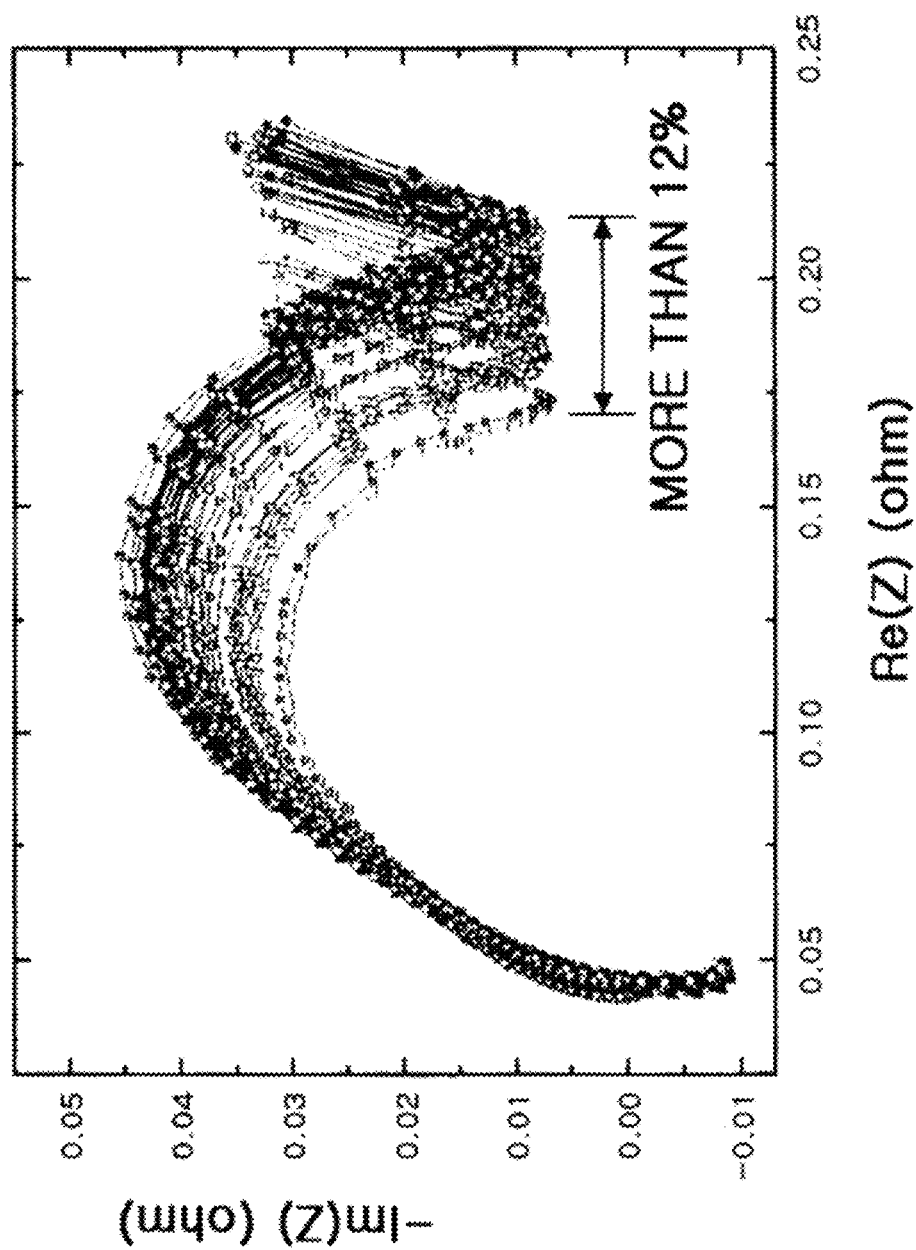
FIG. 1 is a chart showing impedances of 50 batteries manufactured by the same process.
Figure 2:
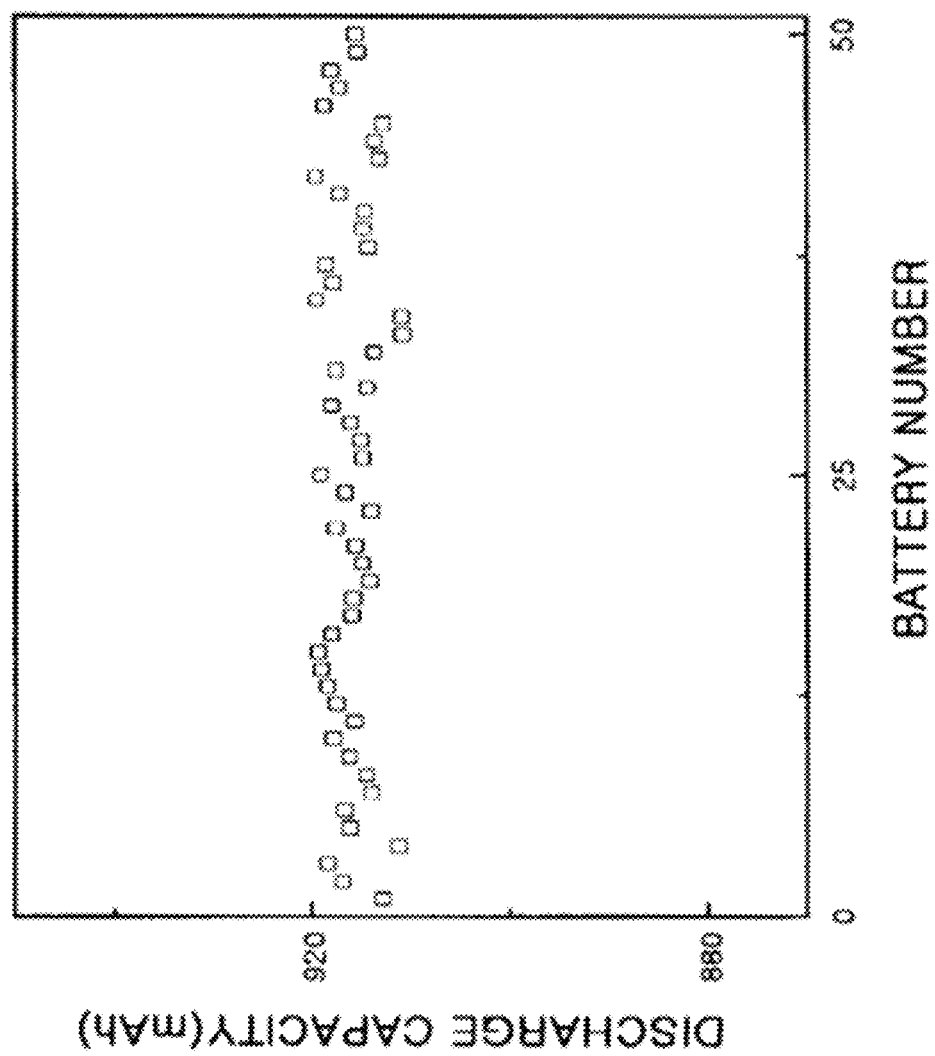
FIG. 2 is a chart showing capacities of 50 batteries manufactured by the same process.
Figure 3:
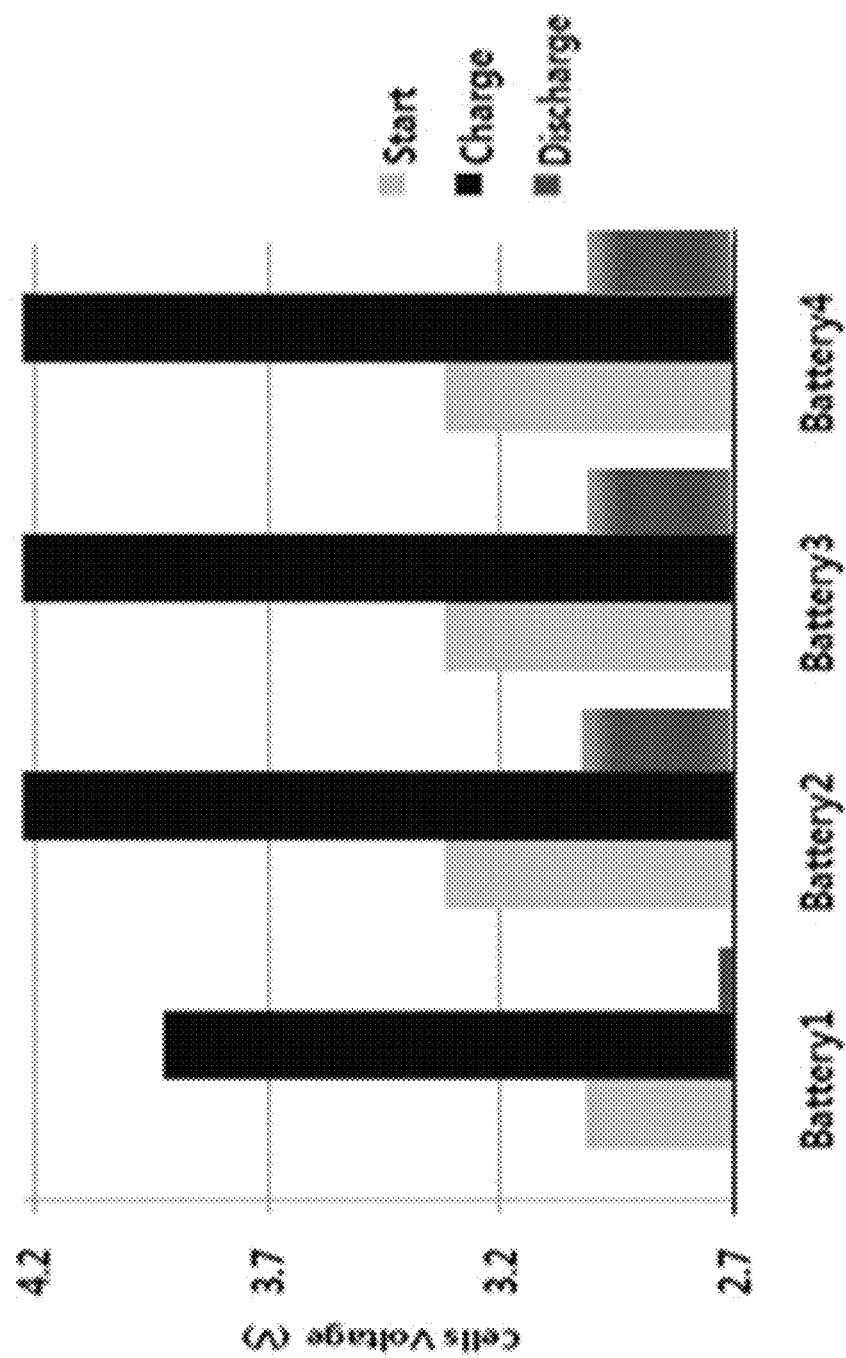
FIG. 3 is a chart showing different charging and discharging voltages of respective batteries.

Hereinafter, embodiments of the present invention will be described with reference to the accompanying drawings. Illustration on parts necessary for understanding the operation according to the present invention will be provided in more detail below. While the embodiments of the present invention have been described, description of technical features which are well known in the technical field of the present invention and are not directly related to the present invention will be omitted. Omitting the unnecessary explanation would be more helpful to convey the present invention more clearly without obscuring the gist of the present invention.

In describing the constituent elements of the present invention, different reference numerals may be given to constituent elements having the same name. In contrast, the same reference numeral may be given to different drawings. However, it means neither that the elements have different functions according to the embodiments, nor that they have the same function in different embodiments. Rather, functions of respective elements should be construed based on the description of the elements in respective embodiments.

Also, the technical terms used in the present specification should be interpreted in the way understood by persons having an ordinary skill in the art of the present invention unless otherwise defined in the present specification. The technical terms should not be construed in a broader sense, or interpreted in an extremely narrower sense.

Also, in the description, a singular form includes a plural referent unless the context clearly indicates otherwise. In the present application, the term 'comprising' or 'including" or the like should not be construed as necessarily including the various elements or steps described in the specification. Or it may be interpreted to include additional elements or steps.

Figure 4:
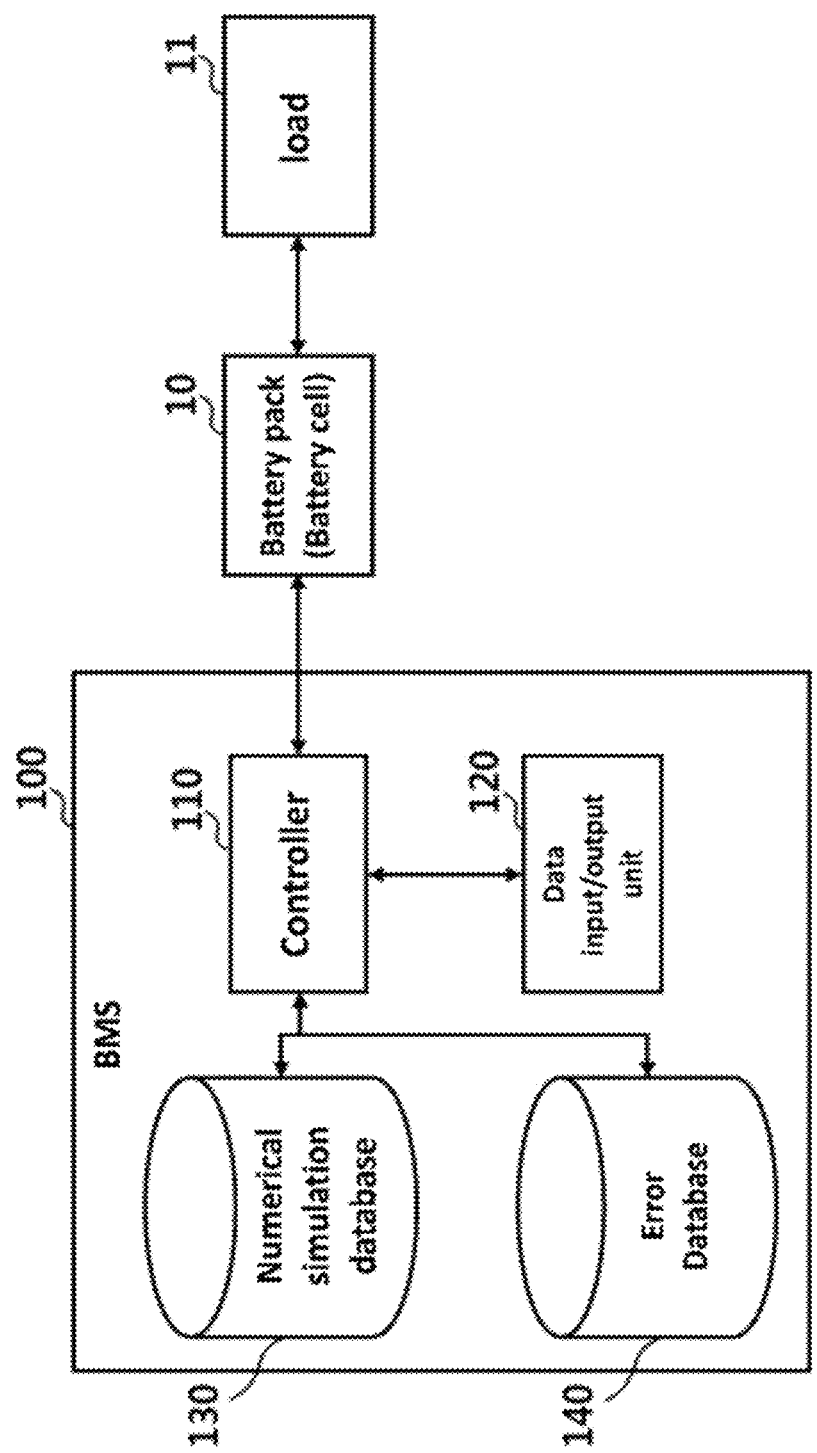
FIG. 4 is a diagram illustrating a configuration of a battery management system to which a method of predicting the state of health of a battery based on numerical simulation data according to an embodiment of the present invention is applied.

FIG. 4 is a diagram illustrating a configuration of a battery management system to which a method for predicting the state of health of a battery based on numerical simulation data according to an embodiment of the present invention is applied.

As shown in FIG. 4, a battery management system 100 according to an embodiment of the present invention includes a controller 110, a data input/output unit 120, a numerical simulation database 130, and an error database 140.

The battery management system (BMS) 110 is monitoring the voltage (V), current (I), temperature (T), etc. of the battery cell (or battery pack) to monitor and manage the state of health (SOH) and the state of charge (SOC) of the battery pack 10.

The battery pack 10 is connected to the load 11 and supplies the stored energy to the load 1.

The battery management system (BMS) according to the embodiment of the present invention provides precise prediction of the state of health (SOH or degree of aging) of a battery using the measurement data measured in a given environment and reference data from the numerical simulation database, thereby allowing the user to know in advance when to replace the battery and to manage it properly.

Hereinafter, the specific configuration and operation of respective components of the battery management system shown in FIG. 4 will be described.

When the numerical analysis result is verified based on a laboratory result through electrical and chemical analysis on the battery, the controller 110 obtains a verified numerical simulation database in which extracted solution data of the battery stored.

When a deviation between reference data read from the verified numerical simulation database and measurement data read from the battery is within a preset range and the battery capacity satisfies a preset condition, the controller 110 executes SOH prediction algorithm to count the number of charges or discharges while charging or discharging.

Thereafter, the controller 110 executes a machine learning algorithm for predicting the state of health of the battery using the number of charges or discharges and a classifier based on a learned machine learning algorithm.

On the other hand, when the deviation between the reference data and the measurement data is out of the preset range, the controller 110 stops charging or discharging of the battery using a safety algorithm.

The data input/output unit 120 receives data required for predicting the state of health of the battery. Also, the data input/output unit 120 may output a predicted state of health of the battery or calculated data related to the battery.

The numerical simulation database 130 stores solution data of the battery extracted using an electrochemical analysis.

The error database 140 stores the error values calculated by the controller 110.

Figure 5:
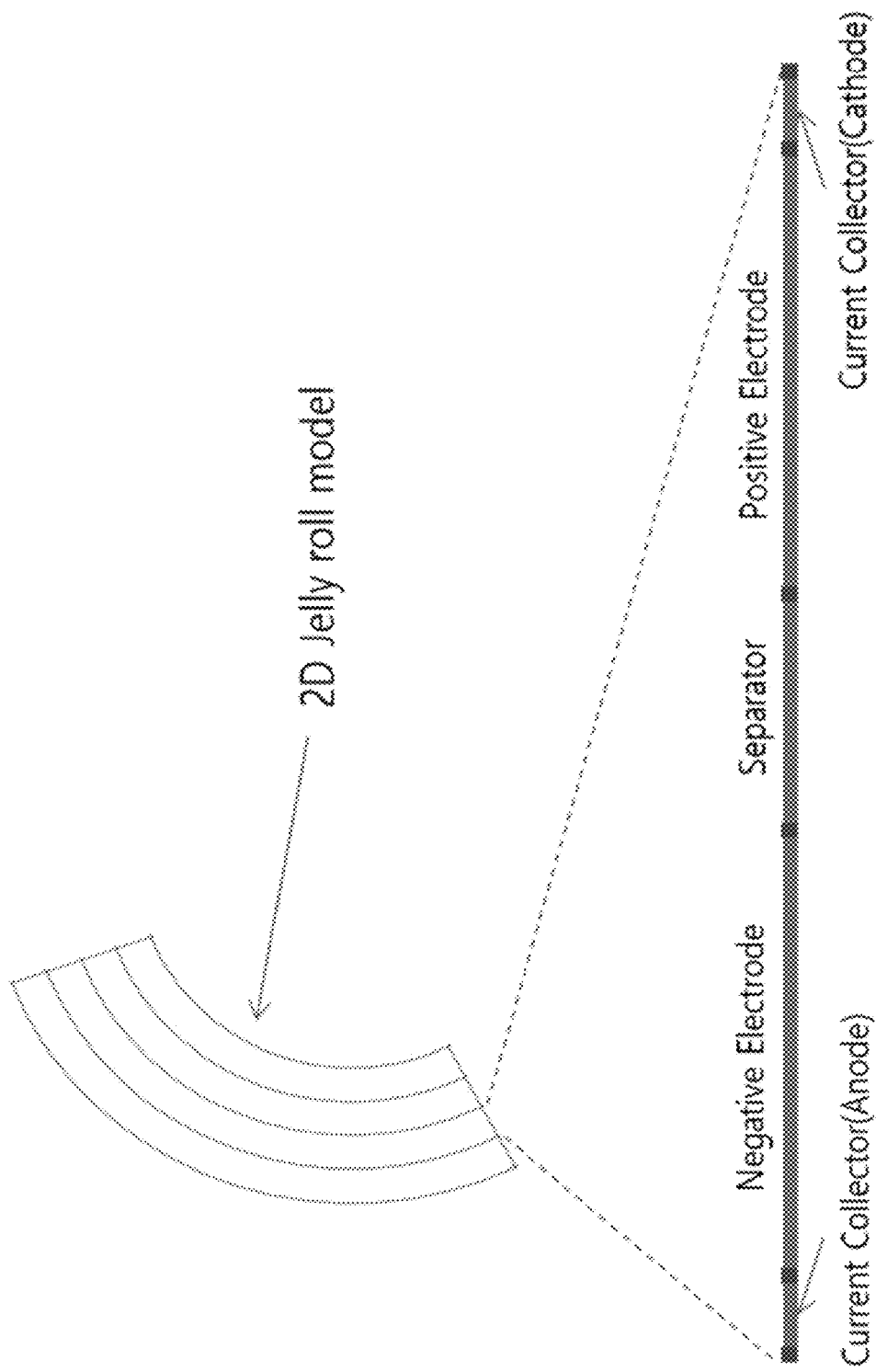
FIG. 5 is a conceptual diagram of a battery to which a one-dimensional battery model and a two-dimensional jelly roll model are applied.

FIG. 5 is a conceptual diagram of a battery to which a one-dimensional battery model and a two-dimensional jelly roll model are applied.

FIG. 5 shows a conceptual view of a lithium ion battery including an anode, a separator, and a cathode. Each electrode contains active material, filler, polymeric binders, and electrolyte. Graphite MCMB2528 and LiMn2O4 are main active materials of the anode and the cathode. The electrolyte is a mixture of propylene carbonate (PC, 10% vol), ethylene carbonate (EC, 27% vol) and dimethyl carbonate (DMC, 63% vol). On the other hand, the porous separation membrane includes a liquid electrolyte and p (VdF-HFP).

The physical phenomenon of the lithium ion battery can be expressed by the following equations (1) to (7). These represent physical dominant phenomena of voltage and material transport (concentration) under electrolyte and solid state, current balancing within a battery and energy balance based on thermodynamic theory.

a) Potential in the Electrolyte $$\nabla \Phi_2 = -\frac{i_2}{\kappa} + \frac{2RT}{F}(1 - t_+^0)\left(1 + \frac{d\ln f_+}{d\ln c}\right)\nabla \ln c \quad \text{[Equation 1]}$$

b) Potential in Solid.

$$I - i_2 = -\sigma \nabla \Phi_1 \quad \text{[Equation 2]}$$

c) Transport in the Electrolyte $$\varepsilon \frac{\partial c}{\partial t} = \nabla \cdot \varepsilon D\left(1 - \frac{d\ln c_0}{d\ln c}\right)\nabla c + \frac{t_+^0 \nabla \cdot l_2 + l_2 \cdot \nabla t_+^0}{z_+ v_+ F} - \nabla \cdot cv_0 + aj_- \quad \text{[Equation 3]}$$

d) Transport in Solid.

$$\frac{\partial c_s}{\partial t} = \frac{\partial}{\partial x}\left(D_s \frac{\partial c_s}{\partial x}\right) \quad \text{[Equation 4]}$$

e) Reaction Rate $$i_n = i_0\left[\exp\left(\frac{\alpha_a F(\Phi_1 - \Phi_2 - U)}{RT}\right) - \exp\left(\frac{\alpha_c F(\Phi_1 - \Phi_2 - U)}{RT}\right)\right] \quad \text{[Equation 5]}$$

f) Current Balance $$\nabla i_2 = a i_{in} \quad \text{[Equation 6]}$$

g) Energy Balance $$\dot{Q} = IV + \int \sum_l a i_{n,l}(x)\left(U_l(c_s(x)) - T\frac{\partial U_l(c_s(x))}{\partial T}\right)dx + C_p \frac{dT}{dt} \quad \text{[Equation 7]}$$

Where, a is a surface area of active material per electrode volume, c is a salt concentration of an electrolyte, cs is a lithium concentration at a solid insertion electrode, Cp is heat capacity, D is a salt diffusion coefficient, Ds is a diffusion coefficient of lithium at an insertion electrode, f_± is an average molar activation coefficient of an electrolyte, F is the Faraday constant, in represents a current transfer in a direction perpendicular to a surface of active material, i0 is an exchange current density, i2 is a current density in an electrolyte (surface area), I is a total current density of a cell, j is a total flux (of active material), n is the number of electrons involved in reaction, Q is a heat generation rate, R is the normal gas constant, s is a stoichiometric coefficient which is positive for anodic reactants, t is time, $t\_i^0$ ($t_i^0$) is the number of transitions of a species 'i' to a solvent rate, T is a temperature in Kelvin, v is a velocity, z i is charge of ion i.

In addition, α is a transport coefficient, ε is a volume fraction (of the electrolyte, unless otherwise specified), κ is an effective ion conductivity, v is the number of moles of ions in which one mole of electrolyte is dissociated, a is an effective electron conductivity of a porous electrode, and Φ represents electric potential. a is an anode, c is a cathode, i is a species i, + is an anode, and − is a cathode.

The above equations are partial differential equations derived from a basic theory of lithium ion batteries. A commercial multi-physics package program is used to solve Equations (1) to (7), which are dominant partial differential equations of a battery cell considering internal electrochemical reaction. COMSOL's computational reliability of current numerical models has been verified in previous reports by comparing with experimental results related to charge and discharge of a battery and a surface temperature. Deviations between the experimental results and the simulation models were considered within tolerances of temperature and voltage.

Figure 6:
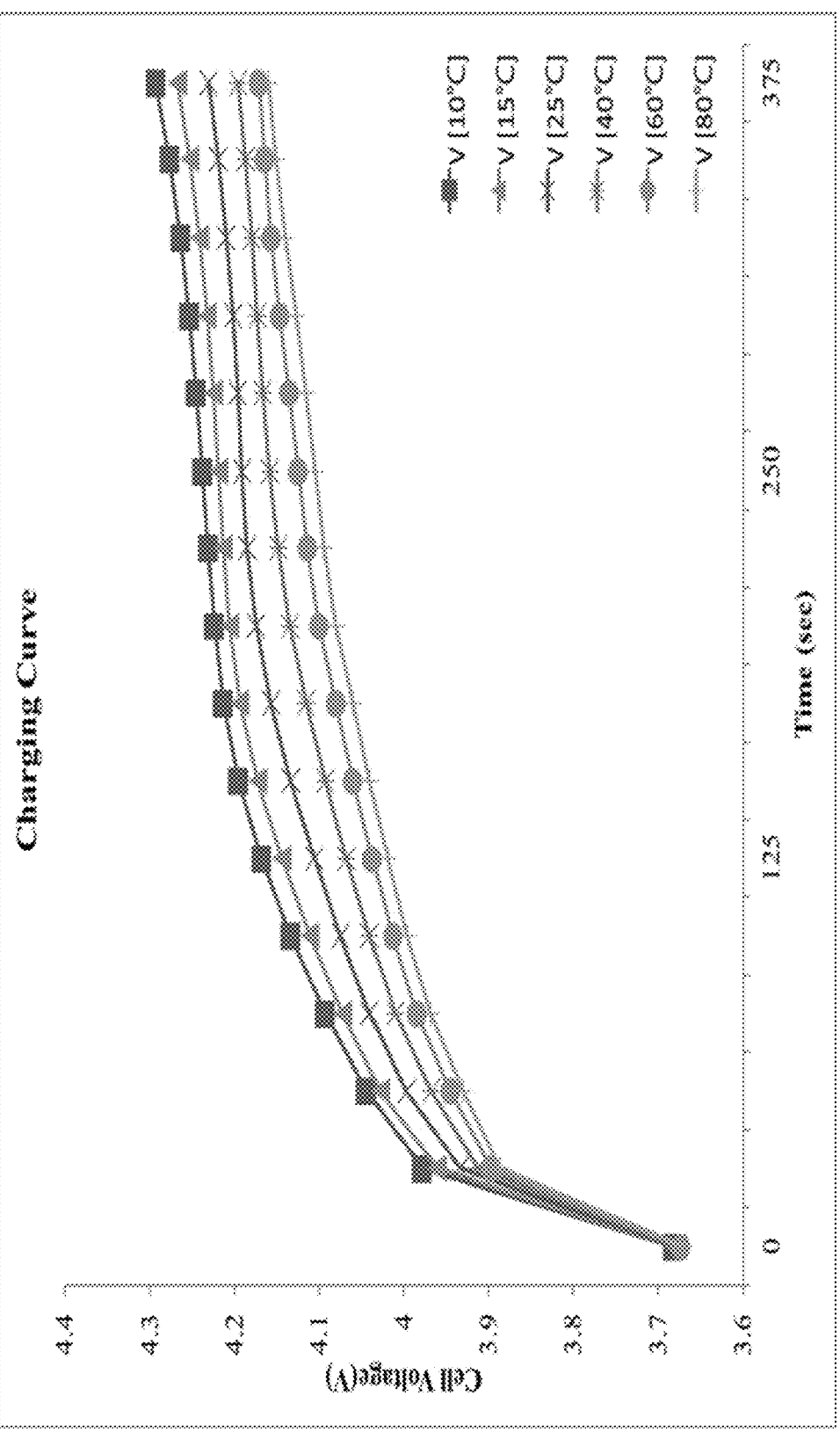
FIG. 6 is a chart showing a lithium ion battery charge curve at various temperatures.
Figure 7:
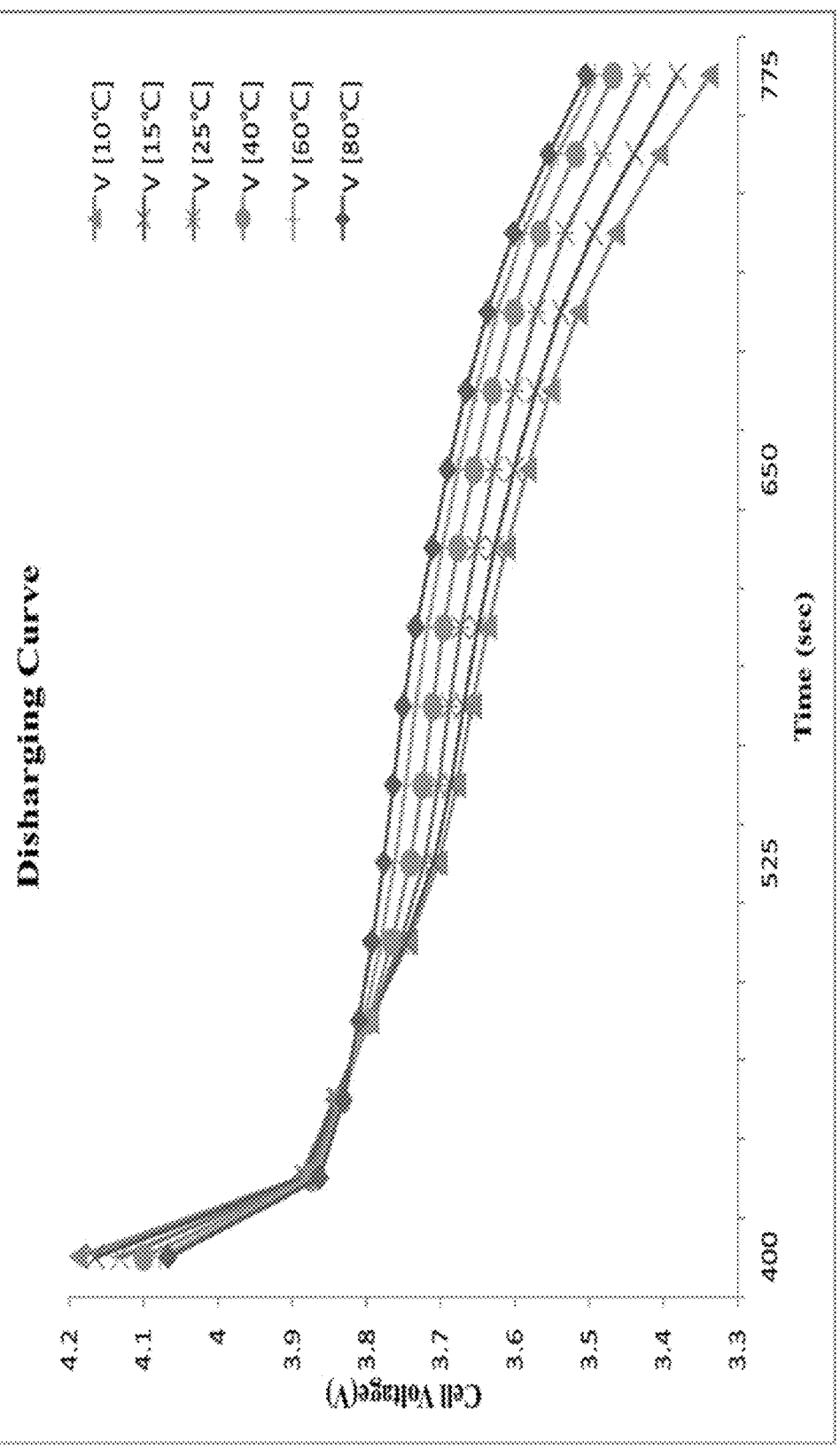
FIG. 7 is a chart showing a lithium ion battery discharge curve at various temperatures.

FIG. 6 is a chart showing a lithium ion battery charging curve at various temperatures. FIG. 7 is a chart showing a lithium ion battery discharging curve at various temperatures.

In order to obtain predicted simulation data by a reliable numerical method, a numerical model of the battery pack should be optimally designed. Cells should be equally balanced at surface temperature. Therefore, an embodiment of the present invention can predict simulation data regarding to SOC and SOH of internal performance of the battery cell at different environmental temperatures.

FIGS. 6 and 7 show changes in charging and discharging rates of a cylindrical lithium ion battery case at various temperatures. For each simulation, it is assumed that the environmental temperature of the battery cell has been kept constant from the beginning. The experimental results indicate that the lower the ambient temperature, the higher the charging and discharging rate. When the temperature is lowered, the reaction rate also falls inside the battery in the similar manner that a capacity of an old battery reduces.

Figure 8:
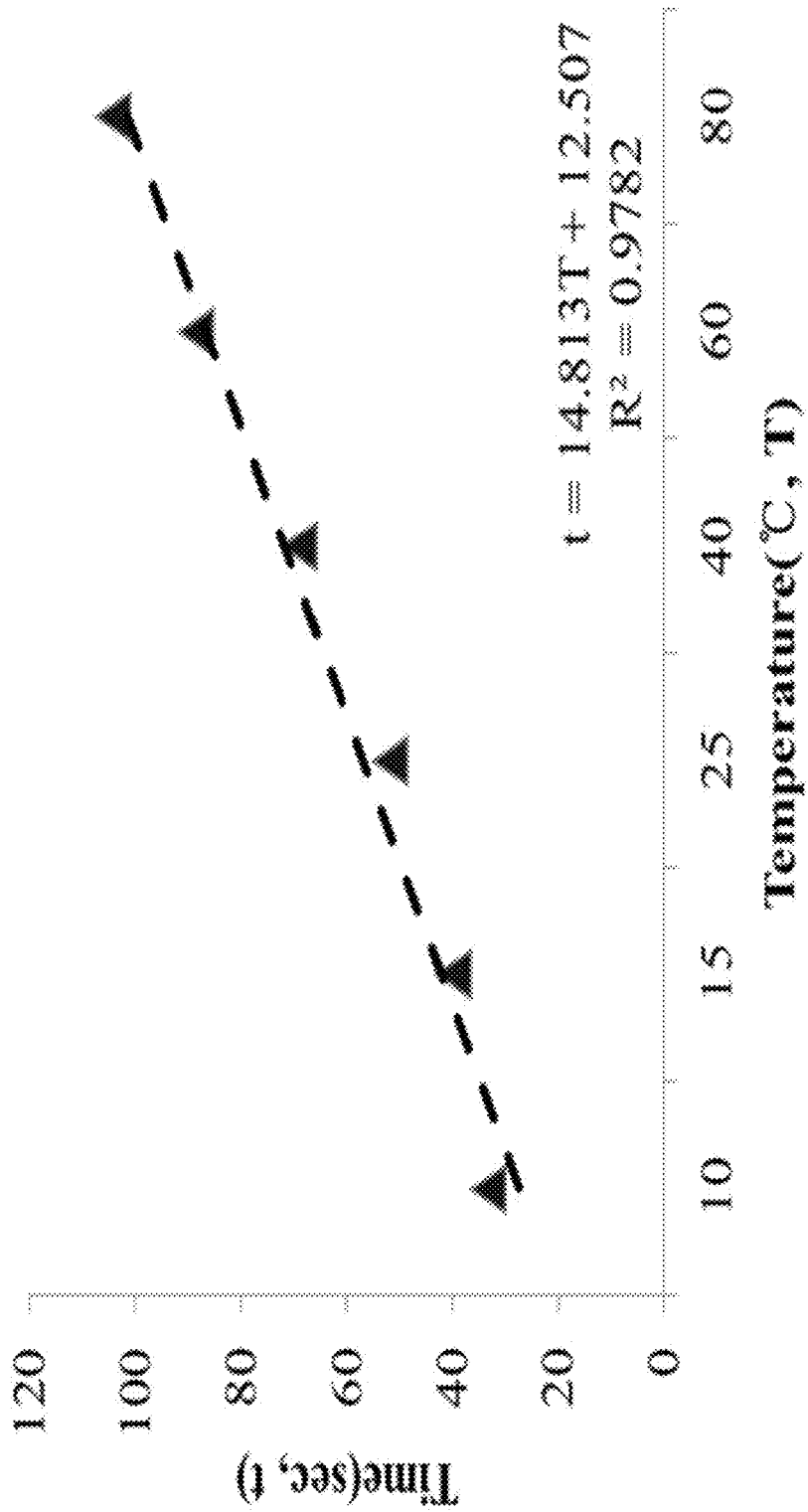
FIG. 8 is a chart showing time (one cycle) necessary to reach 4V at given charge temperatures.
Figure 9:
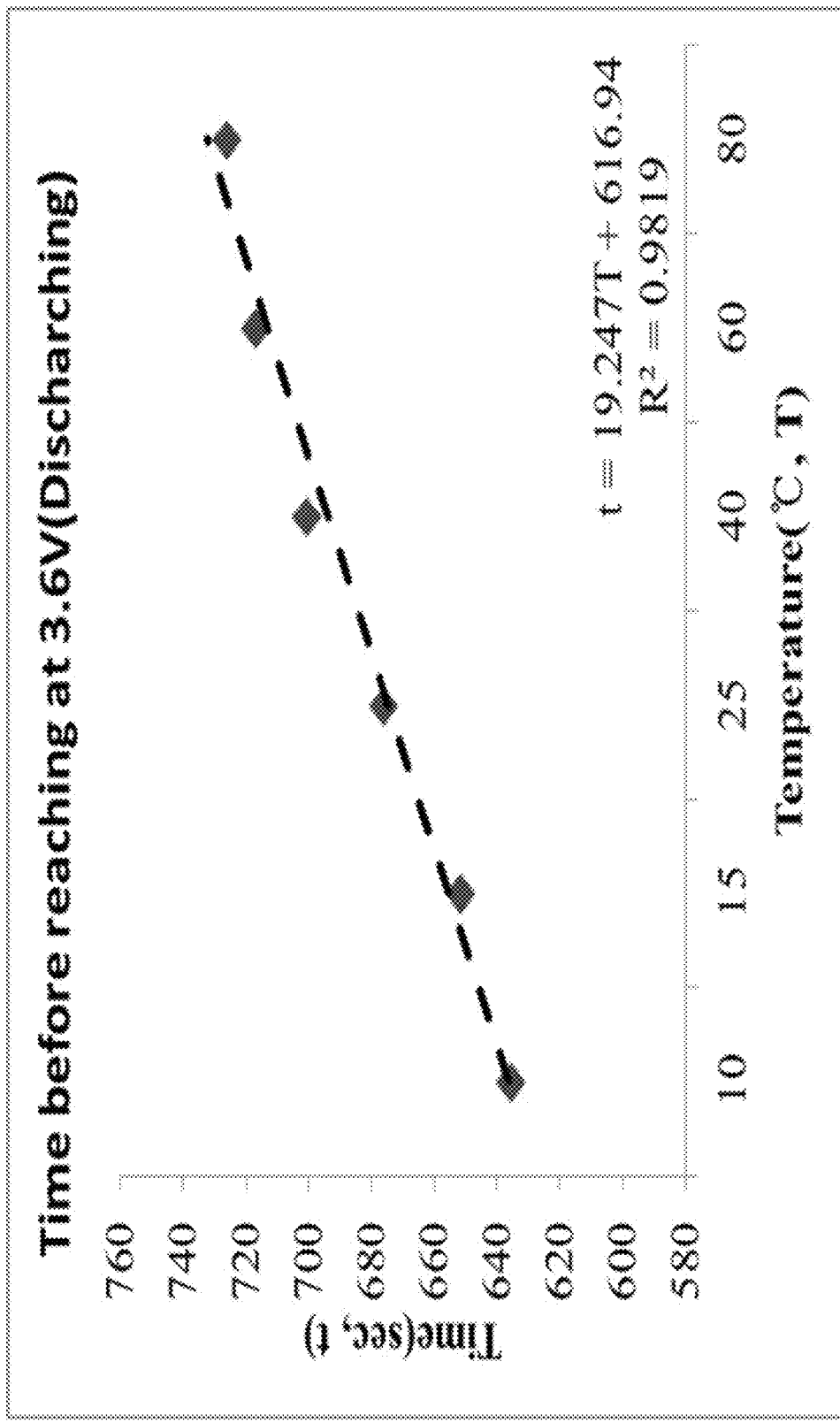
FIG. 9 is a chart showing time (one cycle) necessary to reach 3.5V at given discharge temperatures.

FIG. 8 is a chart showing a time (one cycle) necessary to reach 4V when charged at various temperatures. FIG. 9 is a chart showing a time (one cycle) necessary to reach 3.5V when discharged at various temperatures.

FIGS. 8 and 9 show the times required to reach target charging and discharging voltages at various environmental temperatures for quantitative analysis of the effect of temperature. The target voltages are determined between 4V and 3.6V which are the upper and the lower voltages of a commonly used lithium ion battery, respectively. Both figures show that charging and discharging rates increase or decrease linearly at various environmental temperatures. Formulas and values created by linear regression analysis are shown in drawings. The temperature values and formulas in FIGS. 8 and 9 are derived from a temperature range between 10 and 80 degrees Celsius.

Thus, FIGS. 6 to 9 show predicted voltage changes of the SOC and the charging or discharging times necessary to reach target voltages at various cell surface temperatures.

A method for predicting the state of health of a battery according to an embodiment of the present invention provides a new algorithm for SOC and SOH prediction based on numerical sample cases with reliable big data predicted related to SOC and SOH.

On the other hand, there are two methods for predicting the SOH of a battery cell at different temperatures. One method is to determine the remaining battery life of a battery cell under normal charging and discharging conditions by checking operating time or calculating periodic operation frequency. Another method is to provide an alarm or replacement signal to BMS when an abnormal operation lasts for a predetermined time within a given tolerance. Embodiments of the present invention focus on the second approach to derive an SOH prediction algorithm based on normal data obtained through various reliable numerical analyses. Therefore, SOC is obtained by a validated numerical model in a normal temperature range. Verified numerical models also provide a sufficient database on voltages generally required.

Figure 10:
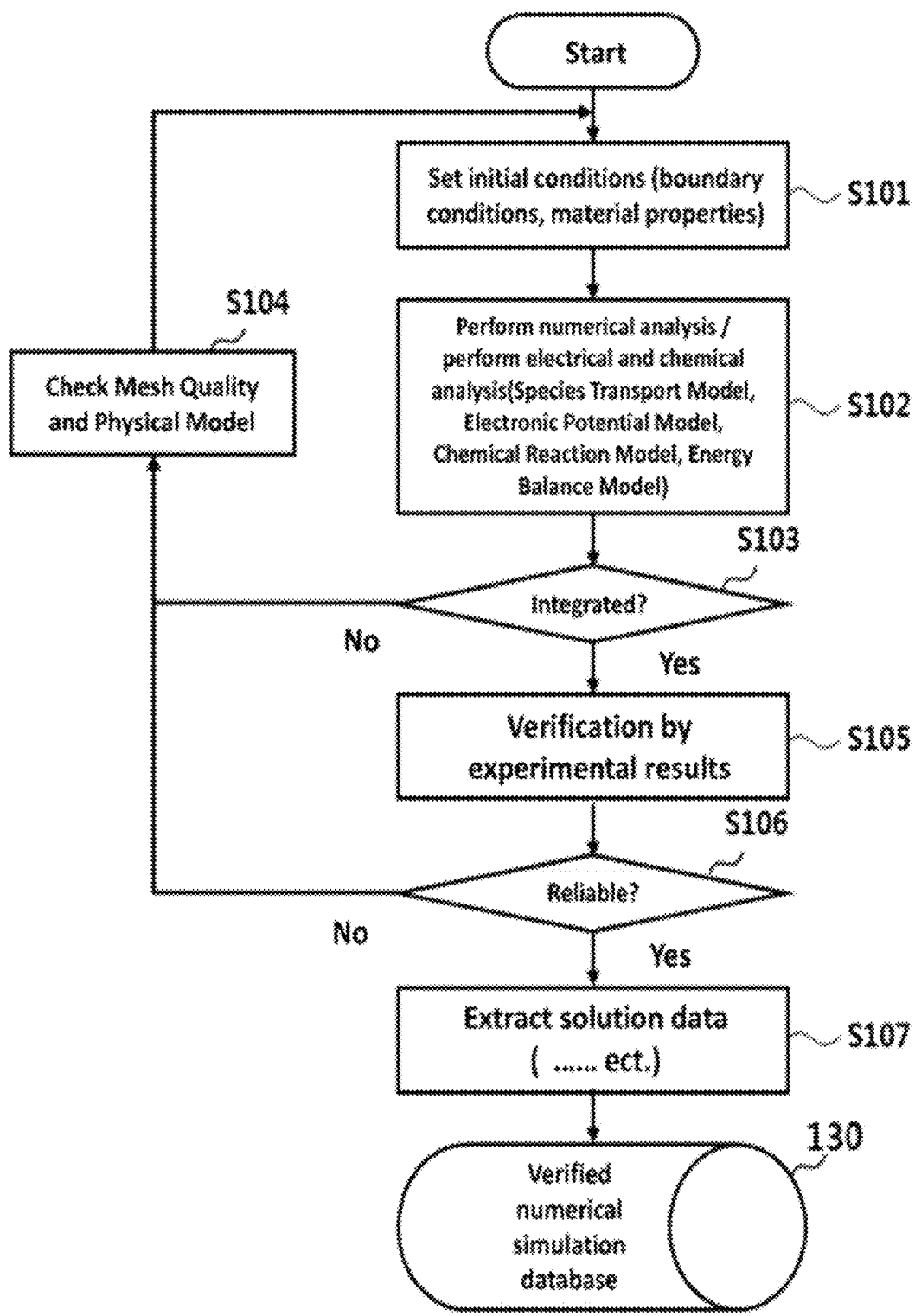
FIG. 10 is a flowchart for obtaining a numerical simulation database verified by numerical analysis according to an embodiment of the present invention.

FIG. 10 is a flowchart for obtaining numerical simulation database verified by numerical analysis according to an embodiment of the present invention.

FIG. 10 shows a numerical simulation flowchart for obtaining a reliable reference database to be used in SOH prediction algorithm of a battery. The SOH prediction algorithm should be coded in the controller 110 of a battery management system. The controller 110 detects an abnormal state that the battery is out of a normal range of voltage on the database when the battery is charged and discharged at various temperatures.

In addition to the voltage change to be calculated, the database for time necessary to reach the required voltage at various temperatures provides a normal state to apply a SOH prediction algorithm. Thus, when the real-time measurement data in the battery management system 100 deviates from a proposed normal standard database, the alarm informs the abnormal state in advance. Repeated and cumulated data from the lithium ion battery pack can improve the database and error detection conditions using AI algorithms, thereby capable of providing faster and more accurate SOH prediction. Data generated from existing data and artificial intelligence algorithms are repeatedly combined with new numerical simulation data. Through this operation, the newly generated data is classified, extracted and manipulated to predict the SOH of a lithium ion battery cell.

As shown in FIG. 10, the battery management system 100 sets initial conditions (S101).

For example, the battery management system 100 may set boundary conditions and material properties.

The battery management system 100 performs a numerical analysis (S102).

Specifically, the battery management system 100 performs an electrochemical analysis. For example, the electrochemical analysis can be performed based on Species Transport Model, Electronic Potential Model, Chemical Reaction Model, or Energy Balance Model.

The battery management system 100 is checking an integrated state (S103).

Upon checking the result (S103), if not integrated, the battery management system 100 checks Mesh Quality and Physical Model (S104).

Upon checking the result (S103), if integrated, the battery management system 100 is verified by using experimental results (S105).

The battery management system 100 checks reliability (S106).

Upon the check (S106), if not reliable, the battery management system 100 performs the step S104 of checking Mesh Quality and Physical Model.

Upon the check (S106), if reliable, solution data are extracted (S107).

The battery management system 100 stores the extracted solution data in a verified numerical simulation database.

Figure 11:
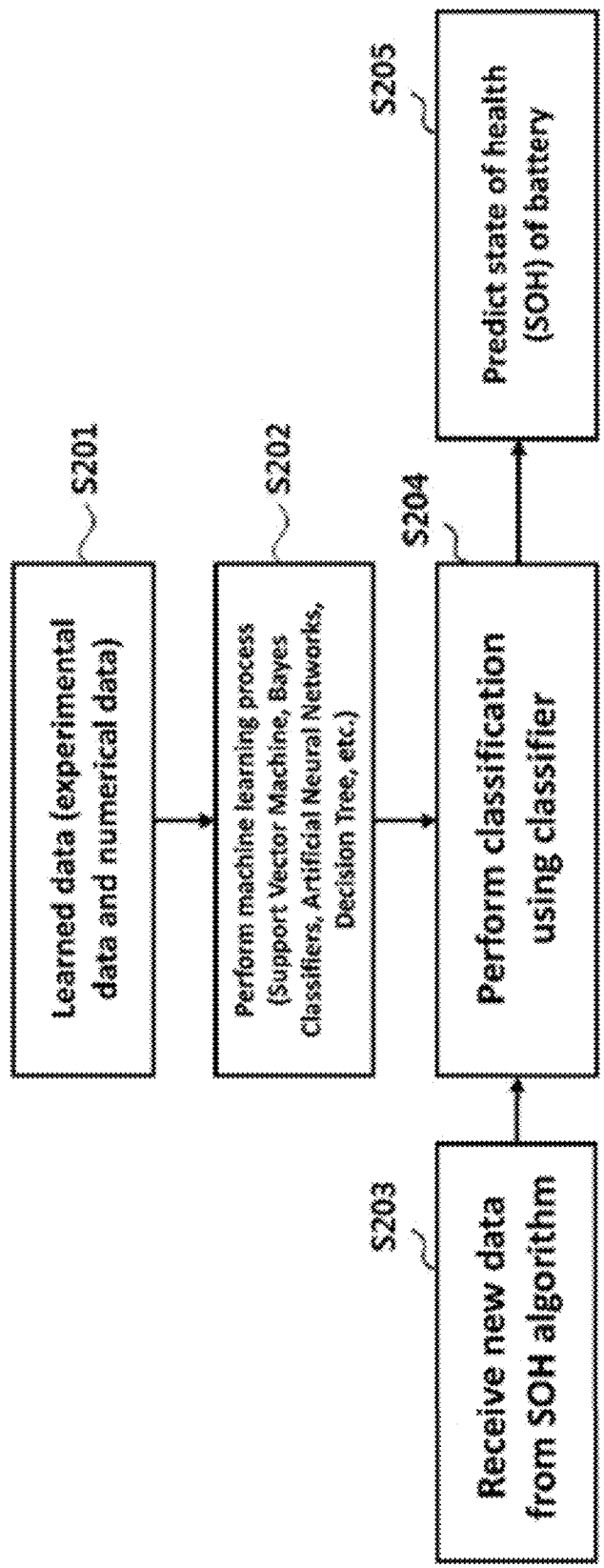
FIG. 11 is a flowchart illustrating a method for predicting the state of health of a battery using a machine learning algorithm according to an embodiment of the present invention.

FIG. 11 is a flowchart illustrating a method of predicting the state of health of a battery using a machine learning algorithm according to an embodiment of the present invention.

FIG. 11 shows a flowchart of an AI algorithm based on verified numerical simulation data.

The battery management system 100 obtains training data including existing experimental data and numerical data (S201).

The battery management system 100 performs a machine learning process using learning data and based on a machine learning algorithm (S201). For example, the machine learning algorithm may include Support Vector Machine, Bayes Classifiers, Artificial Neural Networks, Decision Tree, or the like.

Thereafter, the battery management system 100 receives new data from the prediction algorithm for the battery state of health (SOH) (S203). New data is received from algorithms shown in FIGS. 12 to 16.

The classifier of the battery management system 100 classifies the received new data based on a learned machine learning algorithm (S204).

The battery management system 100 performs a process of predicting the state of health of the battery (S205).

An SOH prediction algorithm based on a simulated voltage will be described below.

FIGS. 6 and 7 show that the characteristics of the lithium ion battery depending on environmental temperature. A reliable database computed through numerical simulation can be used as standard reference data to identify a deviation degree of a given voltage which is measured at a different temperature. If the measured data does not follow a proposed voltage change at a certain temperature within a given tolerance, it can be determined that the operating battery cell may not be in a good state of health.

Figure 12:
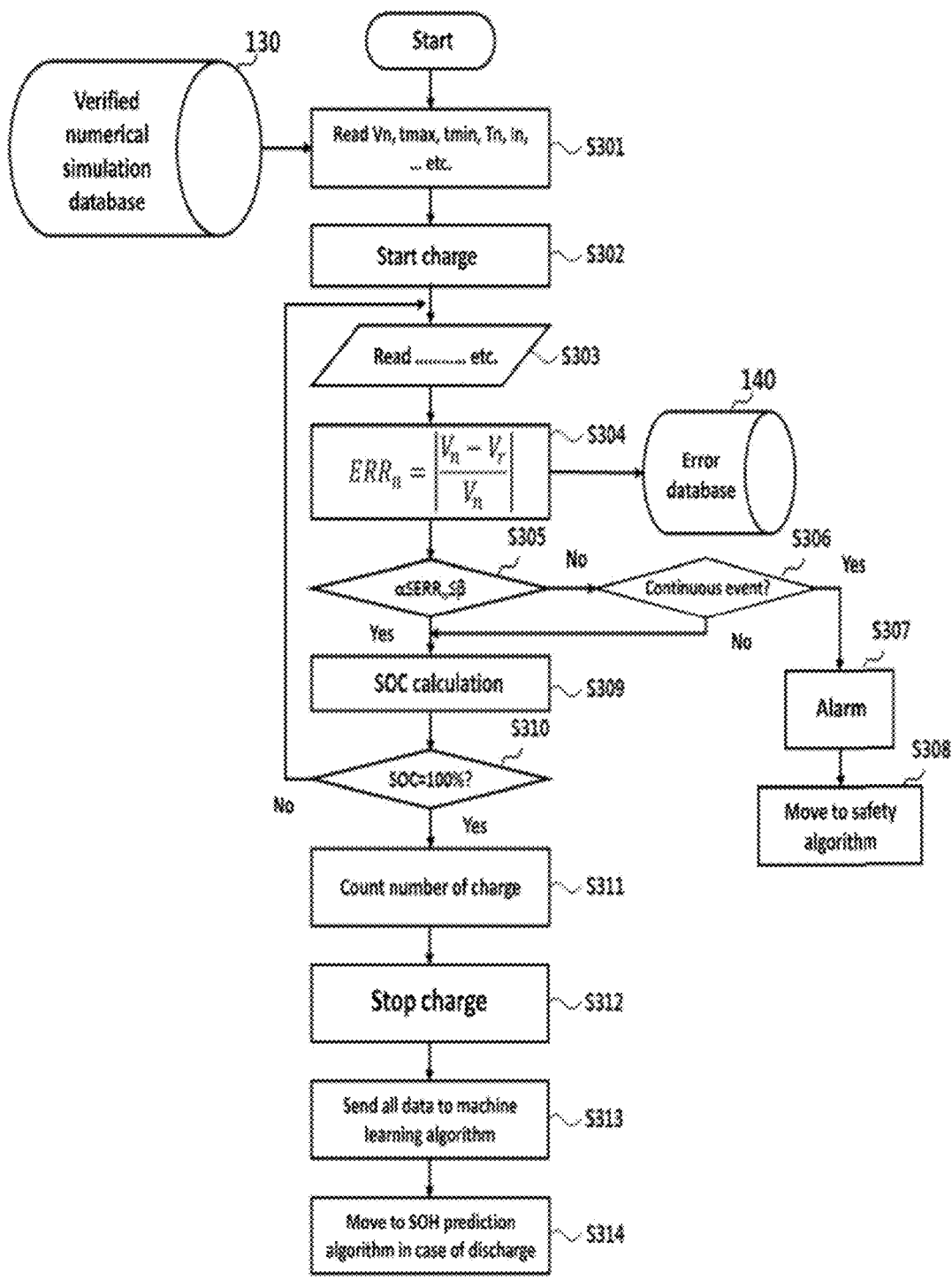
FIG. 12 is a flowchart illustrating an SOH prediction algorithm based on voltages measured in real-time during charging according to an embodiment of the present invention.
Figure 13:
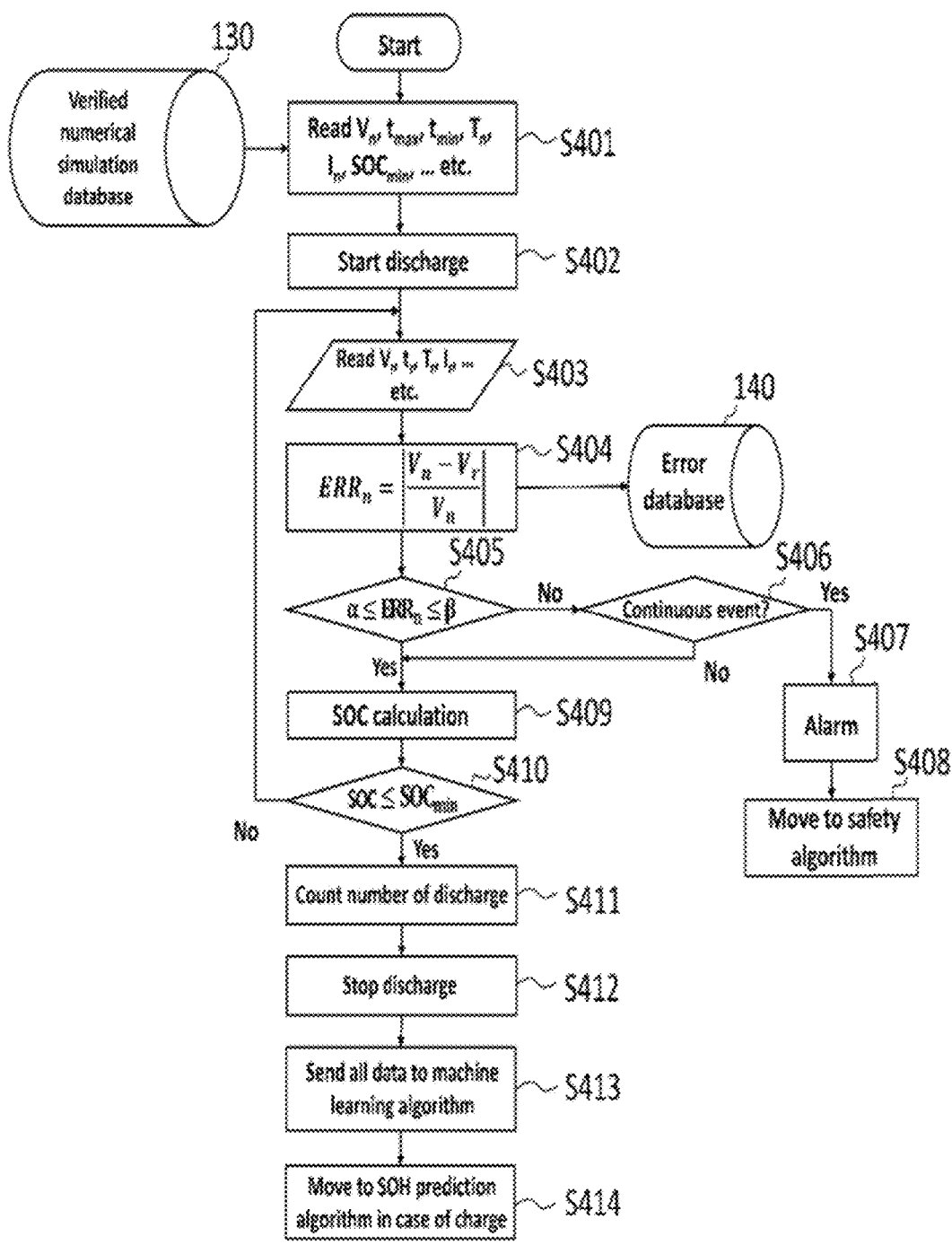
FIG. 13 is a flowchart illustrating an SOH prediction algorithm based on voltages measured in real-time during discharging according to an embodiment of the present invention.

A logical flowchart for predicting the SOH is shown in FIGS. 12 and 13 for the case of charging and discharging. $V_n$ is reference data of a reference voltage accumulated by a reliable numerical simulation at a specific temperature, and $V_r$ is measurement data of battery cell voltages measured in real time. The deviation of the two values of $V_n$ and $V_r$ may be used to determine whether an alarm is sent only to the battery management system 100 or whether to immediately stop the battery cell. The safety algorithm of the battery management system 100 should be selected and operated only in the case of alarm.

Figure 14:
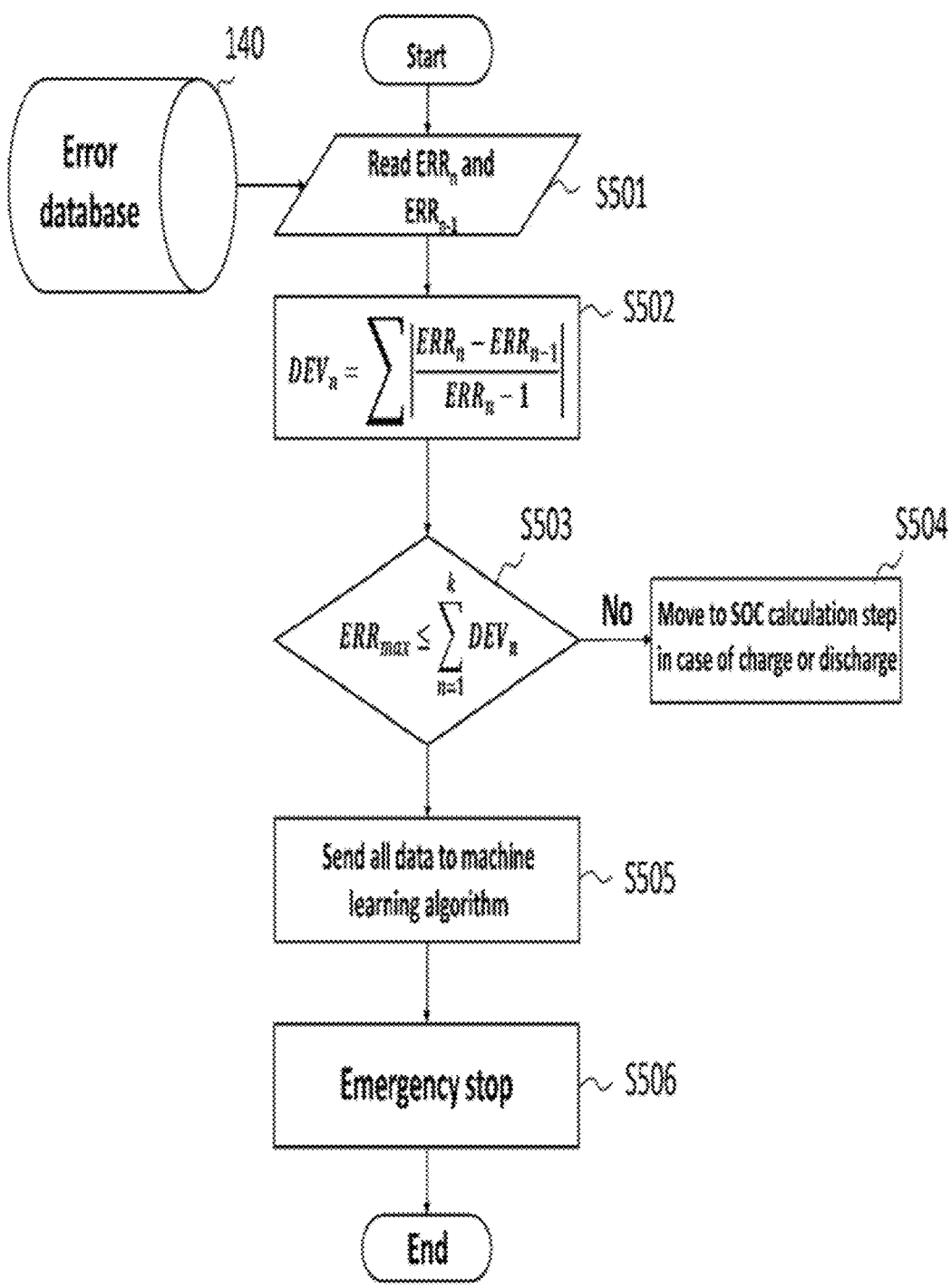
FIG. 14 is a flowchart illustrating a safety algorithm for emergency stopping according to an embodiment of the present invention.

An algorithm for making a final decision is required because the battery cell cannot be stopped for any alarm, and such a safety algorithm is shown in FIG. 14. The algorithm for the final decision checks the accumulated error data with a certain number of cycles and an emergency stop should be executed when this value exceeds the maximum error value ($ERR_{max}$).

FIG. 12 is a flowchart illustrating an SOH prediction algorithm based on real-time measured voltage during charging according to an embodiment of the present invention.

The battery management system 100 reads a reference voltage $V_n$, a maximum allowable time $t_{max}$, a minimum allowable time $t_{min}$, a reference temperature $T_n$, a reference current $I_n$, and etc. (S301).

The battery starts charging (S302).

The battery management system 100 reads the measured voltage $V_r$, the measurement time $t_r$, the measured temperature $T_r$, the measured current $I_r$, and etc from a battery during charging (S303).

The battery management system 100 calculates an n-th error value $ERR_n$ according to Equation (8) below (S304). The battery management system 100 stores the calculated $ERR_n$ in the error database 140.

$$ERR_n = \left|\frac{V_n - V_r}{V_n}\right| \quad \text{[Equation 8]}$$

Where, $ERR_n$ is an n-th error value, $V_n$ is reference data of a reference voltage accumulated by the reliable numerical simulation at a specific temperature, and $V_r$ is measurement data of a battery cell voltage measured in real time.

The battery management system 100 determines whether $ERR_n$ is within a preset range (S305).

If the $ERR_n$ is not within the preset range, the battery management system 100 determines whether the event is continuous (S306).

When it is determined in step S306 that the $ERR_n$ is not within a preset range and the event is continuous, the battery management system 100 executes alarm in step S307.

The battery management system 100 moves to the safety algorithm and executes the safety algorithm (S308). The safety algorithm is shown in FIG. 14.

If the $ERR_n$ is not within a preset range and the event is not continuous in step S305, the battery management system 100 calculates SOC (S309).

If the $ERR_n$ is within the preset range, the battery management system 100 executes the step S309 of calculating battery SOC.

The battery management system 100 determines whether the calculated SOC is 100% (S310).

If the calculated battery capacity is not 100%, the battery management system 100 moves to S303 and reads $V_r$, $t_r$, $T_r$, $I_r$, . . . , etc from the battery.

If the calculated battery capacity is 100%, the battery management system 100 counts the number of charges of the battery (S311).

The battery management system 100 stops charging (S312).

The battery management system 100 transmits all the data to a machine learning algorithm (S313). A machine learning algorithm is shown in FIG. 11.

The battery management system 100 moves to SOH prediction algorithm for discharging and executes SOH prediction algorithm for discharging (S314). The SOH prediction algorithm for discharging is shown in FIG. 12.

FIG. 13 is a flowchart illustrating SOH prediction algorithm based on a real-time measurement voltage during discharging according to an embodiment of the present invention.

The battery management system 100 reads $V_n$, $t_{max}$, $t_{min}$, $T_n$, $I_n$, $SOC_{min}$, etc from the verified numerical simulation database 130 (S401).

The battery starts discharging (S402).

The battery management system 100 reads $V_r$, $t_r$, $T_r$, $I_r$, . . . , etc from discharging battery (S403).

The battery management system 100 calculates $ERR_n$ according to Equation (8) in the above (S404). The battery management system 100 stores the calculated $ERR_n$ in the error database 140.

The battery management system 100 determines whether $ERR_n$ is within a preset range (S405).

If $ERR_n$ is not within a preset range (S405), the battery management system 100 determines whether the event is continuous (S406).

If it is determined in step S406 that the $ERR_n$ is not within a preset range and the event is continuous, the battery management system 100 executes alarm in step S407.

The battery management system 100 moves to safety algorithm and executes safety algorithm. The safety algorithm is shown in FIG. 13 (S408).

If $ERR_n$ is not within a preset range and the event is not continuous, the battery management system 100 calculates SOC (S409).

If $ERR_n$ is within a preset range, the battery management system 100 executes step S409 of calculating SOC.

The battery management system 100 determines whether the calculated SOC is less than or equal to $SOC_{min}$ (S410).

If the calculated SOC exceeds the $SOC_{min}$ in step S410, the battery management system 100) reads $V_r$, $t_r$, $T_r$, $I_r$, . . . , etc from the battery in step S403.

If the calculated SOC is less than or equal to $SOC_{min}$ in step S410, the battery management system 100 counts the number of discharges (S411).

The battery management system 100 stops discharging (S412).

The battery management system 100 transmits all the data to the machine learning algorithm (S413). The machine learning algorithm is shown in FIG. 11.

The battery management system 100 moves to SOH predicting algorithm for discharging and executes SOH predicting algorithm for discharging (S414). The SOH prediction algorithm for discharge is shown in FIG. 12.

FIG. 14 is a flowchart illustrating a safety algorithm for an emergency stop according to an embodiment of the present invention.

The battery management system 100 reads the n-th $ERR_n$ and the (n−1)-th $ERR_{n-1}$ from the error database (S501).

The battery management system 100 calculates the sum $DEV_n$ of the deviations of the n-th $ERR_n$ and the (n−1)-th $ERR_{n-1}$ according to Equation (9) (S502).

$$DEV_n = \sum \left|\frac{ERR_n - ERR_{n-1}}{ERR_{n-1}}\right| \quad \text{[Equation 9]}$$

The battery management system 100 determines whether the maximum error $ERR_{max}$ is less than or equal to a sum of the first DEV through the k-th DEV (S503).

When the maximum error $ERR_{max}$ exceeds the sum of the first DEV through the k-th DEV, the battery management system 100 calculates SOC for discharge shown in FIGS. 11 and 12 (S504).

If the maximum error $ERR_{max}$ is less than or equal to the sum of the first DEV through the k-th DEV in step S503, the battery management system 100 transmits all data to the machine learning algorithm shown in FIG. 10 (S505).

The battery management system 100 executes emergency stop (S506).

The SOH prediction algorithm based on charging and discharging time will be described below. FIGS. 11 and 12 show an SOH prediction algorithm in which SOH can be predicted based on voltage data having a deviation between measurement data and reference data. In addition to the voltage data for evaluating SOH, time measurement is needed for charging and discharging rates for aged and malfunctioning battery cells. As the battery cell reaches its end of life or the life of the battery cell becomes shortened, the charging time or the charging time necessary to reach an upper limit or a lower limit voltage level is shortened.

Figure 15:
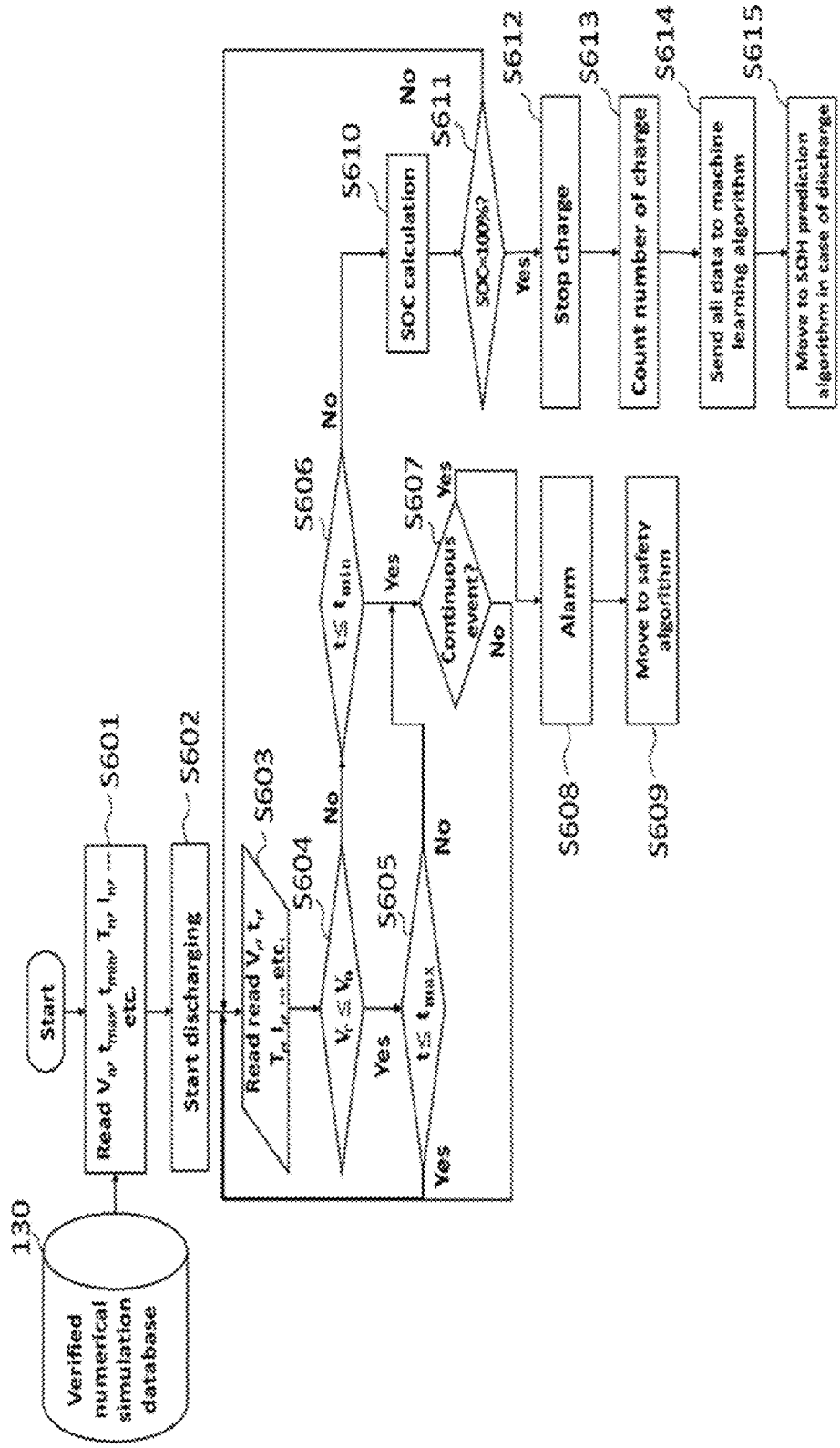
FIG. 15 is a flowchart illustrating an SOH prediction algorithm based on a time to reach the maximum voltage during charging according to an embodiment of the present invention.
Figure 16:
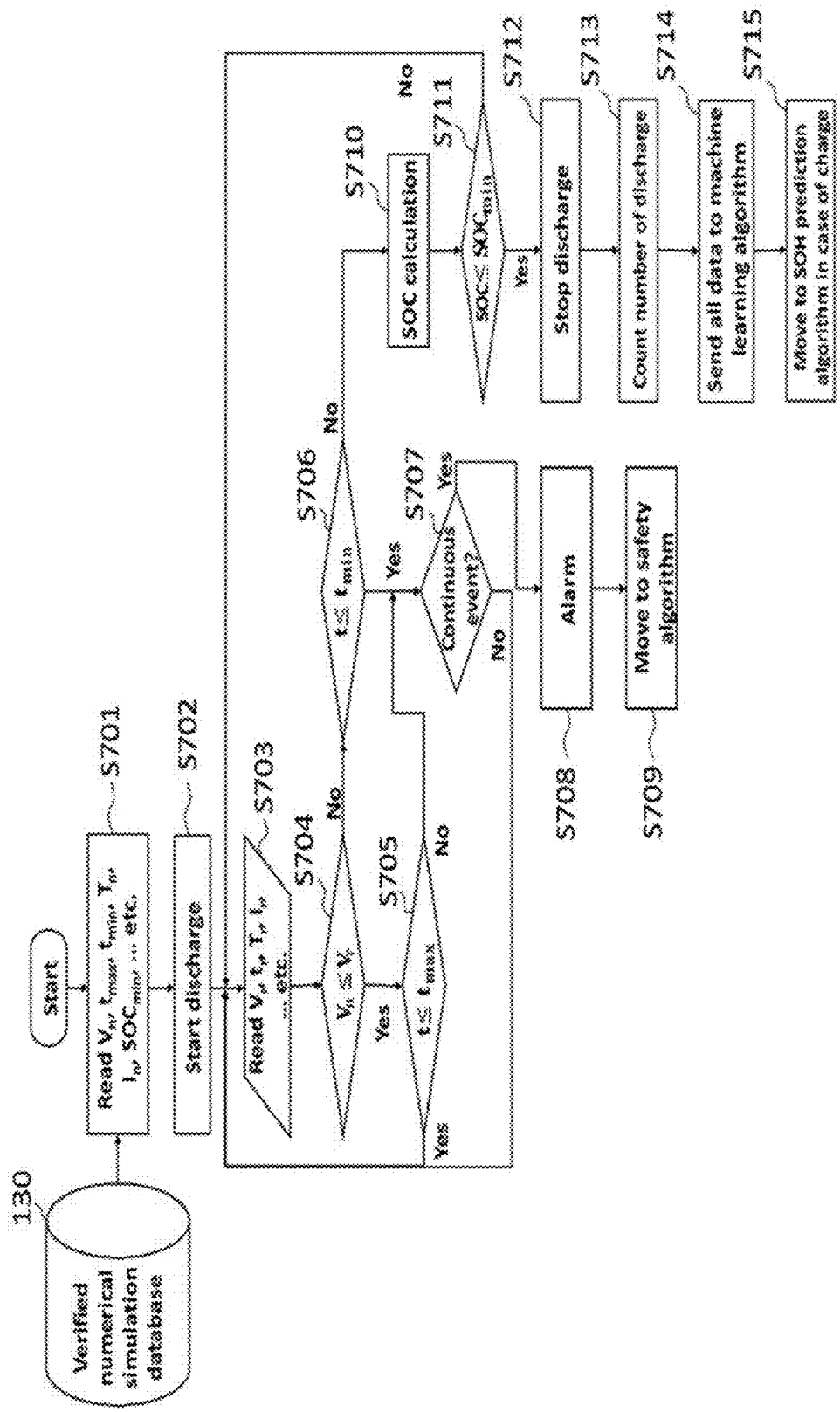
FIG. 16 is a flowchart illustrating an SOH prediction algorithm based on a time to reach the minimum voltage during discharging according to an embodiment of the present invention.

FIGS. 15 and 16 show a logic flowchart for predicting the SOH based on time when charging or discharging is performed. $t_{max}$ and $t_{min}$ are the maximum and minimum allowable times to reach target charge and discharge voltages, respectively. A value exceeding the maximum and minimum allowable target values means that the state of the battery cell is in an abnormal state and an algorithm for controlling this limit should be implemented.

FIG. 15 is a flowchart illustrating an SOH prediction algorithm based on a time to reach a maximum voltage during charging according to an embodiment of the present invention.

The battery management system 100 reads $V_n$, $t_{max}$, $t_{min}$, $T_n$, $I_n$, ..., etc. from a verified numerical simulation database (S601).

The battery management system 100 starts charging the battery (S602).

The battery management system 100 reads $V_r$, $t_r$, $T_r$, $I_r$, ..., etc. from the battery in charging (S603).

The battery management system 100 determines whether $V_r$ is less than or equal to $V_n$ (S604).

If $V_r$ is less than or equal to $V_n$, the battery management system 100 determines whether t is less than or equal to $t_{max}$ (S605).

If it is determined that t is less than or equal to $t_{max}$ in step S605, the battery management system 100 reads $V_r$, $t_r$, $T_r$, $I_r$, ..., etc in step S603.

If $V_r$ is not less than or equal to $V_n$ in step S604, the battery management system 100 determines whether t is less than or equal to $t_{min}$ (S606).

If t is less than or equal to $t_{min}$ in step S606, the battery management system 100 determines whether it is a continuous event (S607).

On the other hand, if it is determined that t is not less than or equal to $t_{max}$ (S605), the battery management system 100 executes step S607 to check whether it is a continuous event.

If the event is not continuous in step S607, the battery management system 100 reads $V_r$, $t_r$, $T_r$, $I_r$, ..., etc. in step S603.

On the other hand, if the event is continuous (S607), the battery management system 100 executes alarm (S608).

The battery management system 100 moves to the safety algorithm and executes the safety algorithm (S609). The safety algorithm is shown in FIG. 13.

If t is not less than or equal to $t_{min}$ in step S606, the battery management system 100 calculates the SOC (S610).

The battery management system 100 determines whether the calculated SOC is 100% (S611).

If it is determined that the calculated SOC is not 100%, the battery management system 100 reads $V_r$, $t_r$, $T_r$, $I_r$, ..., etc. in step S603.

If the calculated SOC is 100% (S611), the battery management system 100 stops charging (S612).

The battery management system 100 counts the number of charges (S613).

The battery management system 100 transmits all the data to the machine learning algorithm (S614). The machine learning algorithm is shown in FIG. 11.

The battery management system 100 moves to the SOH prediction algorithm for discharging and executes the SOH prediction algorithm for discharging (S615). The SOH prediction algorithm for discharging is shown in FIG. 13.

FIG. 16 is a flowchart illustrating an SOH prediction algorithm based on a time to reach a maximum voltage during discharging according to an embodiment of the present invention.

The battery management system 100 reads $V_n$, $t_{max}$, $t_{min}$, $T_n$, $I_n$, $SOC_{min}$, ..., etc from a verified numerical simulation database (S701).

The battery management system 100 starts discharging the battery (S702).

The battery management system 100 reads $V_r$, $t_r$, $T_r$, $I_r$, ..., etc. (S703).

The battery management system 100 determines whether Vn is less than or equal to $V_r$ (S704).

If Vn is less than or equal to $V_r$ in step S704, the battery management system 100 determines whether t is less than or equal to $t_{max}$ (S705).

If t is less than or equal to $t_{max}$ in step S705, the battery management system 100 reads $V_r$, $t_r$, $T_r$, $I_r$, ..., etc. in step S703.

If $V_n$ is less than or equal to $V_r$ in step S704, the battery management system 100 determines whether t is less than or equal to $t_{min}$ (S706).

If t is less than or equal to $t_{min}$ in step S706, the battery management system 100 determines whether it is a continuous event (S707).

On the other hand, if it is determined that t is not less than or equal to $t_{max}$ (S705), the battery management system 100 executes step S707 to determines whether the event is continuous.

As a result of the check (S707), if the event is not continuous, the battery management system 100 reads $V_r$, $t_r$, $T_r$, $I_r$, ..., etc. in step S703.

On the other hand, if the event is a continuous event (S707), the battery management system 100 executes alarm (S708).

The battery management system 100 moves to the safety algorithm and executes safety algorithm (S709). The safety algorithm is shown in FIG. 13.

If it is determined that t is not less than or equal to $t_{min}$ in step S706, the battery management system 100 calculates a battery capacity SOC (S710).

The battery management system 100 determines whether the calculated battery capacity is $SOC_{min}$ or less (S711).

If the calculated battery capacity is not less than or equal to the $SOC_{min}$ in step S711, the battery management system 100 read $V_r$, $t_r$, $T_r$, $I_r$, ..., etc. from the battery in step S703.

If it is determined in step S711 that the calculated battery capacity is less than or equal to $SOC_{min}$, the battery management system 100 stops discharging in step S712.

The battery management system 100 counts the number of discharges (S713).

The battery management system 100 transmits all the data to the machine learning algorithm (S714). The machine learning algorithm is shown in FIG. 11.

The battery management system 100 moves to the SOH prediction algorithm at the time of charging and performs an SOH prediction algorithm at the time of charging (S715). The SOH prediction algorithm at the time of charging is shown in FIG. 13.

As described above, a method for predicting a state of health of a battery according to the embodiment of the present invention relates to a battery management system (BMS) algorithm for predicting the state of health (SOH) of a lithium ion battery based on numerical analysis data. The SOH prediction method according to an embodiment of the present invention is reliable as verified by experiment. The reliable numerical simulation database computed through numerical simulation can be used as standard reference data to determine the amount of deviation of a given voltage measured at different temperatures. If the measured data does not follow a predetermined voltage change at a given temperature, it can be determined that the operating battery cell may not be in a satisfactory state of health.

In addition to voltage data for evaluating SOH, time measure is needed for charge and discharge rates for aged and malfunctioning battery cells. Embodiments of the present invention can provide a logic algorithm for predicting SOH when charged and discharged over time.

The SOH prediction method predicts the state of health of a battery using a voltage change and a charging/discharging time. These two SOH prediction methods show that algorithms based on numerical big data can be applied to other lithium ion battery cells to predict SOC and SOH. Error values (ERR) in a SOH prediction method can be self-accumulated using an improved artificial intelligence (AI) algorithm such as deep running, and can be improved more suitably.

While the present invention has been described in connection with, it will be understood by those skilled in the art that the present invention may be embodied in other specific forms without departing from the spirit or essential characteristics thereof.

Therefore, it should be understood that the above-described embodiments are, in all respects, illustrative and not restrictive, and the scope of the invention described in the detailed description is defined by the appended claims. All equivalents thereof are to be construed as being included within the scope of the present invention.

What is claimed is:

1. A method for predicting a state of health of a battery based on a numerical data, the method being performed by a battery management system and comprising:
a step of obtaining a verified numerical simulation database, which solution data of the battery is extracted from and stored in, when a numerical analysis result is verified by an experimental result using electrical and chemical analysis of the battery;
a step of counting the number of charges or discharges when a deviation between reference data read from the verified numerical simulation database and measurement data read from the battery is within a preset range and battery capacity satisfies a preset condition; and
a step of predicting the state of health of the battery using the number of charges or discharges and a classifier based on a learned machine learning algorithm,
wherein the step of obtaining comprises:
a step of setting an initial condition for the battery;
a step of performing numerical analysis through electrical and chemical analysis of the battery;
a step of verifying the numerical analysis result by the experimental result;
a step of extracting the solution data of the battery with respect to the numerical analysis result when the step of verifying completes; and
a step of storing the extracted solution data in the verified numerical simulation database and obtaining the data from the verified numerical simulation database.

2. The method for predicting the state of health of the battery based on the numerical simulation data of claim 1, wherein the step of performing the numerical analysis uses at least one of a Species Transport Model, an Electronic Potential Model, a Chemical Reaction Model, and an Energy Balance Model.

3. A method for predicting a state of health of a battery based on numerical simulation data, comprising:
a step of obtaining a verified numerical simulation database, which solution data of the battery is extracted from and stored in, when a numerical analysis result is verified by an experimental result using electrical and chemical analysis of the battery;
a step of counting the number of charges or discharges when a deviation between reference data read from the verified numerical simulation database and measurement data read from the battery is within a preset range and battery capacity satisfies a preset condition; and
a step of predicting the state of health of the battery using the number of charges or discharges and a classifier based on a learned machine learning algorithm,
wherein the step of counting comprises:
in case of the battery being charged, counting the number of charges and stopping charging when the battery is fully charged; and
in case of the battery being discharged, counting the number of discharges and stopping discharging when the battery capacity is at a minimum capacity.

4. A method for predicting a state of health of a battery based on numerical simulation data, the method being performed by a battery management system and comprising:
a step of obtaining a verified numerical simulation database, which solution data of the battery is extracted from and stored in, when a numerical analysis result is verified by an experimental result using electrical and chemical analysis of the battery;
a step of counting the number of charges or discharges when a deviation between reference data read from the verified numerical simulation database and measurement data read from the battery is within a preset range and battery capacity satisfies a preset condition; and
a step of predicting the state of health of the battery using the number of charges or discharges and a classifier based on a learned machine learning algorithm,
wherein the step of counting comprises:
a step of reading the reference data from the verified numerical simulation database;
a step of reading the measurement data from the battery which is being charged or discharged;
a step of calculating the deviation between the read reference data and the read measurement data;

a step of checking whether the deviation calculated is within the preset range;

a step of calculating the battery capacity when the deviation calculated is within the preset range; and a step of counting the number of charges or discharges and stopping charging or discharging when the battery capacity calculated is full charged or is less than or equal to a minimum battery capacity.

5. The method for predicting the state of health of the battery based on the numerical simulation data of claim 1, wherein the step of predicting uses the machine learning algorithm, wherein the machine learning algorithm is Support Vector Machine, Bayes Classifiers, Artificial Neural Networks, or Decision Tree.

6. A method for predicting a state of health of a battery based on numerical simulation data, the method being performed by a battery management system and comprising:

a step of obtaining a verified numerical simulation database, which solution data of the battery is extracted from and stored in, when a numerical analysis result is verified by an experimental result using electrical and chemical analysis of the battery;

a step of counting the number of charges or discharges when a deviation between reference data read from the verified numerical simulation database and measurement data read from the battery is within a preset range and battery capacity satisfies a preset condition;

a step of predicting the state of health of the battery using the number of charges or discharges and a classifier based on a learned machine learning algorithm; and a step of emergency stopping charging or discharging the battery using a safety algorithm when the deviation between the reference data and the measurement data is out of the preset range.

7. The method for predicting the state of health of the battery based on numerical simulation data of claim 6, wherein the step of emergency stopping comprises:

a step of reading n-th error values and (n−1)-th error values from an error database;

a step of calculating a sum of error deviation values of deviations of the n-th error values and the (n−1)-th error values;

a step of determining whether a preset maximum error value is less than or equal to the sum of the error deviation values calculated;

a step of calculating a battery capacity being charged or discharged when the preset maximum error value is more than the sum of the error deviation values calculated; and a step of emergency stopping the battery from being charged or discharged when the preset maximum error value is less than or equal to the sum of the error deviation values calculated, wherein the n-th and (n−1)-th are consecutive ordinal numbers.

8. A method for predicting a state of health of a battery based on numerical simulation data, the method being performed by a battery management system and comprising:

a step of obtaining a verified numerical simulation database, which solution data of the battery is extracted from and stored in, when a numerical analysis result is verified by an experimental result using electrical and chemical analysis of the battery;

a step of comparing measured data read from the battery with reference data read from the verified numerical simulation database;

a step of counting the number of charges when a charging time necessary to reach a first target voltage is within a maximum allowable time and battery capacity satisfies a first preset condition, or counting the number of discharges when a discharging time necessary to reach a second target voltage is within a minimum allowable time and the battery capacity satisfies a second preset condition; and a step of predicting a state of health of the battery using the number of charges or discharges and a classifier based on a learned machine learning algorithm, wherein the step of obtaining comprises:

a step of setting an initial condition for the battery;

a step of performing numerical analysis through the electrical and chemical analysis of the battery;

a step of verifying the numerical analysis result by the experimental result;

a step of extracting solution data of the battery with respect to the numerical analysis result when the verification completes; and a step of storing the extracted solution data in the verified numerical simulation database and obtaining the data from the verified numerical simulation database.

9. The method for predicting the state of health of the battery based on numerical simulation data of claim 8, wherein the step of performing the numerical analysis performs the numerical analysis using at least one of Species Transport Model, Electronic Potential Model, Chemical Reaction Model, and Energy Balance Model.

10. A method for predicting a state of health of a battery based on numerical simulation data, the method being performed by a battery management system and comprising:

a step of obtaining a verified numerical simulation database, which solution data of the battery is extracted from and stored in, when a numerical analysis result is verified by an experimental result using electrical and chemical analysis of the battery;

a step of comparing measured data read from the battery with reference data read from the verified numerical simulation database;

a step of counting the number of charges when a charging time necessary to reach a first target voltage is within a maximum allowable time and battery capacity satisfies a first preset condition, or counting the number of discharges when a discharging time necessary to reach a second target voltage is within a minimum allowable time and battery capacity satisfies a second preset condition; and a step of predicting the state of health of the battery using the number of charges or discharges counted and a classifier based on a learned machine learning algorithm, wherein the step of counting comprises:

in case of the battery being charged, counting the number of charges and stopping charging when the battery is fully charged; and in case of the battery being discharged, counting the number of discharges and stopping discharging when the battery capacity is at a minimum battery capacity.

11. A method for predicting a state of health of a battery based on numerical simulation data, the method being performed by a battery management system and comprising:

a step of obtaining a verified numerical simulation database, which solution data of the battery is extracted from and stored in, when a numerical analysis result is verified by an experimental result using electrical and chemical analysis of the battery;

a step of comparing measured data read from the battery with reference data read from the verified numerical simulation database;

a step of counting the number of charges when a charging time necessary to reach a first target voltage is within a maximum allowable time and battery capacity satisfies a first preset condition, or counting the number of discharges when a discharging time necessary to reach a second target voltage is within a minimum allowable time and the battery capacity satisfies a second preset condition; and a step of predicting the state of health of the battery using the number of charges or discharges counted and a classifier based on a learned machine learning algorithm, wherein the step of counting comprises:
　a step of reading the reference data from the verified numerical simulation database;
　a step of reading the measurement data from the battery being charged or discharged;
　a step of comparing the measurement data read from the battery with the reference data read from the verified numerical simulation database;
　a step of determining whether the charging time necessary to reach the first target voltage is within the maximum allowable time, or whether the discharging time necessary to reach the second target voltage is within the minimum allowable time;
　a step of calculating the battery capacity when the charging time necessary to reach the first target voltage is within the maximum allowable time and the battery capacity satisfies the first preset condition, or when the discharging time necessary to reach the second target voltage is within the minimum allowable time and the battery capacity satisfies the second preset condition; and
　a step of counting the number of charges or discharges and stopping charging or discharging when the battery capacity calculated is in full or is less than or equal to a minimum battery capacity.

12. The method for predicting the state of health of the battery based on numerical simulation data of claim 8,
wherein the step of predicting uses a machine learning algorithm,
wherein the machine learning algorithm is Support Vector Machine, Bayes Classifiers, Artificial Neural Networks, or Decision Tree.

13. A method for predicting a state of health of a battery based on numerical simulation data, the method being performed by a battery management system and comprising:
　a step of obtaining a verified numerical simulation database, which solution data of the battery is extracted from and stored in, when a numerical analysis result is verified by an experimental result using electrical and chemical analysis of the battery;
　a step of comparing the measured data read from the battery with the reference data read from the verified numerical simulation database;
　a step of counting the number of charges when a charging time necessary to reach a first target voltage is within a maximum allowable time and battery capacity satisfies a first preset condition, or counting the number of discharges when a discharging time necessary to reach a second target voltage is within a minimum allowable time and the battery capacity satisfies a second preset condition;
　a step of predicting the state of health of the battery using the number of charges or discharges and a classifier based on a learned machine learning algorithm; and
　a step of emergency stopping the battery from being charged through a safety algorithm when the charging time is out of the maximum allowable time to reach the first target voltage, or emergency stopping the battery from being discharged through the safety algorithm when the discharging time is out of the minimum allowable time to reach the second target voltage.

14. The method for predicting the state of health of the battery based on numerical simulation data of claim 13, wherein the step of emergency stopping comprises:
　a step of reading n-th error values and (n−1)-th error values from an error database;
　a step of calculating a sum of error deviation values of deviations of the n-th error values and the (n−1)-th error values;
　a step of determining whether a preset maximum error value is less than or equal to the sum of error deviation values calculated;
　a step of calculating battery capacity of the battery under charging or discharging when the preset maximum error value is more than the sum of error deviation values calculated; and
a step of emergency stopping the battery from being charged or discharged when the preset maximum error value is less than or equal to the sum of error deviation values calculated,
　wherein the n-th and (n−1)-th are consecutive ordinal numbers.

* * * * *